(12) United States Patent
Ko et al.

(10) Patent No.: US 12,500,079 B2
(45) Date of Patent: Dec. 16, 2025

(54) SEMICONDUCTOR DEVICE MANUFACTURING METHOD

(71) Applicant: SAMSUNG ELECTRONICS CO., LTD., Suwon-si (KR)

(72) Inventors: Eun Hyea Ko, Suwon-si (KR); Hoon Han, Anyang-si (KR); Byung Keun Hwang, Seongnam-si (KR); Jae Woon Kim, Seoul (KR); Jeong Ho Mun, Yongin-si (KR); Younghun Sung, Seoul (KR); Hyun-Ji Song, Anyang-si (KR); Youn Joung Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 505 days.

(21) Appl. No.: 18/098,856

(22) Filed: Jan. 19, 2023

(65) Prior Publication Data

US 2023/0282475 A1  Sep. 7, 2023

(30) Foreign Application Priority Data

Feb. 7, 2022  (KR) ................. 10-2022-0015372

(51) Int. Cl.
*H01L 21/02* (2006.01)
*G03F 7/038* (2006.01)
(Continued)

(52) U.S. Cl.
CPC ...... *H01L 21/02118* (2013.01); *G03F 7/0387* (2013.01); *G03F 7/094* (2013.01);
(Continued)

(58) Field of Classification Search
CPC ......... H01L 21/02118; H01L 21/02205; H01L 21/02255; H01L 21/0228; H01L 21/31116;
(Continued)

(56) References Cited

U.S. PATENT DOCUMENTS 6,492,075 B1 * 12/2002 Templeton .............. G03F 7/405
216/48
8,158,335 B2 * 4/2012 Yeh ..................... H01L 21/3086
430/394
(Continued)

FOREIGN PATENT DOCUMENTS

JP        2016-103539 A    6/2016
KR       2002-0001195 A    1/2002
KR     10-2020-0038425 A   4/2020

*Primary Examiner* — James M Mellott
(74) *Attorney, Agent, or Firm* — Muir Patent Law, PLLC

(57) ABSTRACT

A semiconductor device manufacturing method includes providing a first layer having a first surface, providing a second layer including a trench that exposes the first surface, onto the first layer, forming a first polymer layer that fills the trench, and performing a heat treatment process on the first polymer layer to form a second polymer layer. A second surface of the second layer is exposed by the trench, the first polymer layer includes a first portion being in contact with the first surface, and a second portion being in contact with the second surface, when the heat treatment process is performed, the first portion of the first polymer layer is decomposed, when the heat treatment process is performed, the second portion of the first polymer layer is cross-linked to form the second polymer layer, and physical properties of the first layer are different from physical properties of the second layer.

18 Claims, 29 Drawing Sheets

(51) Int. Cl.
*G03F 7/09* (2006.01)
*G03F 7/16* (2006.01)
*H01L 21/311* (2006.01)
*H01L 21/56* (2006.01)

(52) U.S. Cl.
CPC ........ *G03F 7/168* (2013.01); *H01L 21/02205* (2013.01); *H01L 21/02255* (2013.01); *H01L 21/0228* (2013.01); *H01L 21/31116* (2013.01); *H01L 21/31138* (2013.01); *H01L 21/56* (2013.01)

(58) Field of Classification Search
CPC .. H01L 21/31138; H01L 21/56; G03F 7/0387; G03F 7/094; G03F 7/168
See application file for complete search history.

(56) References Cited

U.S. PATENT DOCUMENTS

| | | |
|---|---|---|
| 9,443,732 B1 | 9/2016 | Kim et al. |
| 9,530,733 B2 | 12/2016 | Bristol et al. |
| 9,780,008 B2 | 10/2017 | Ono et al. |
| 2009/0053657 A1* | 2/2009 | Hatakeyama ...... C09D 133/066 430/324 |

* cited by examiner

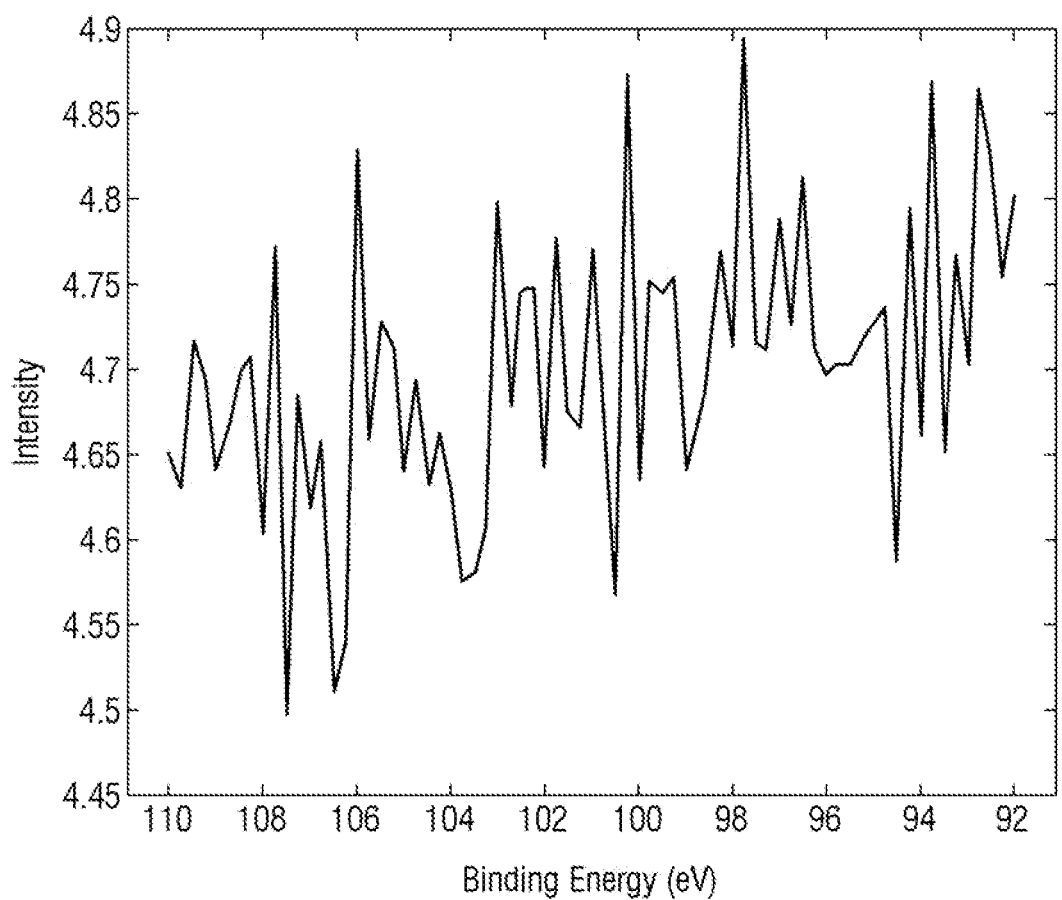

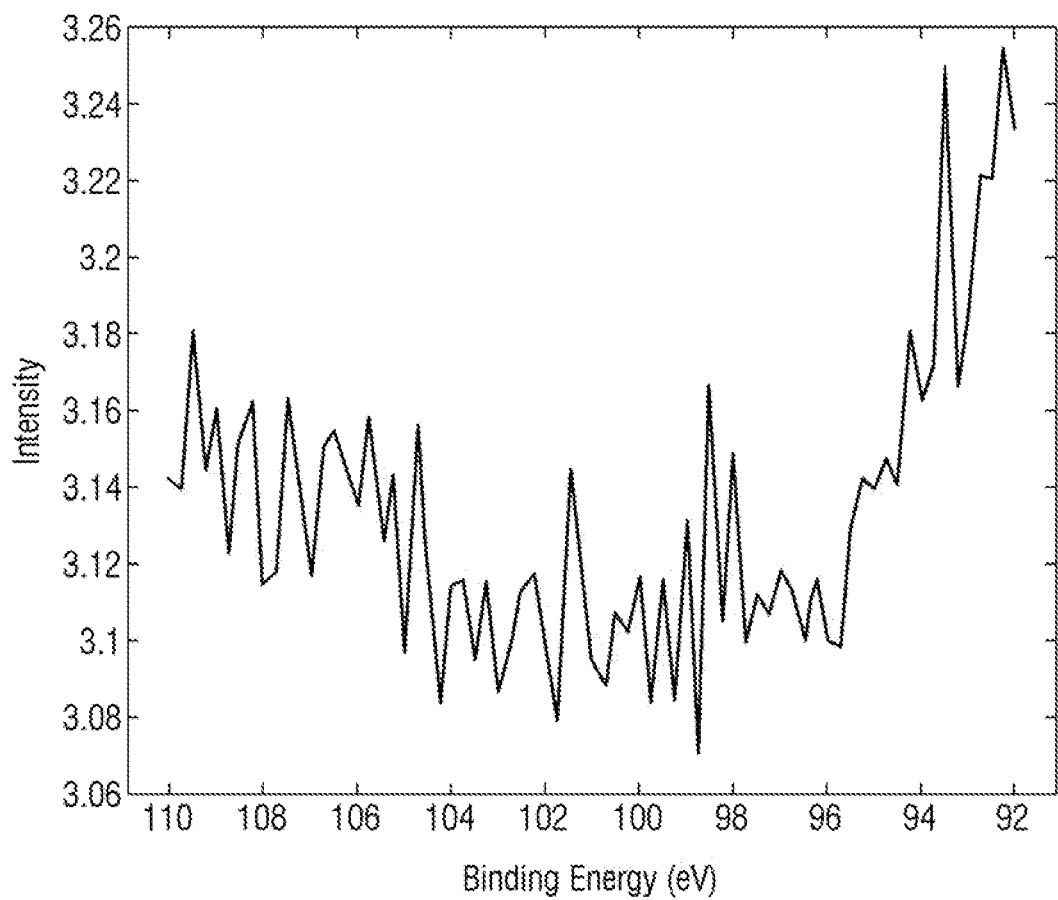

SECOND SURFACE INHIBITOR TREATMENT ONE MINUTE

FIRST SURFACE INHIBITOR TREATMENT ONE MINUTE

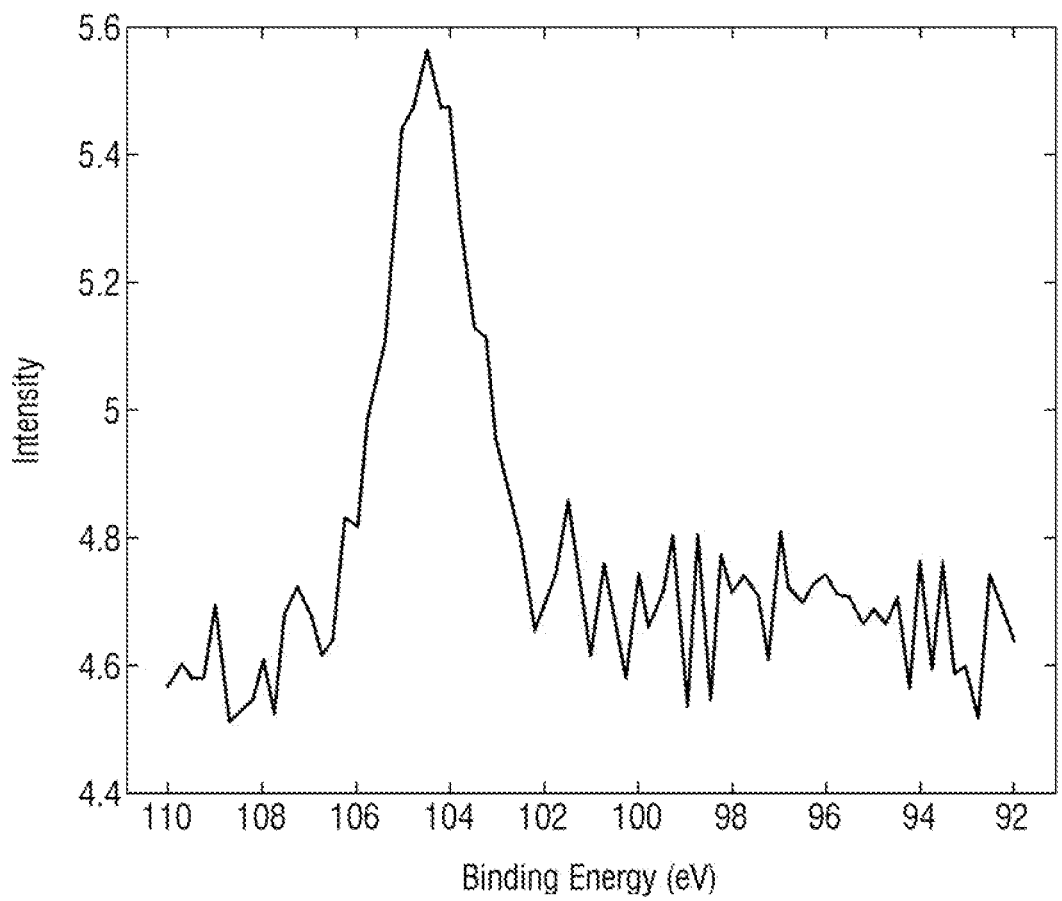

FIRST SURFACE INHIBITOR TREATMENT THREE MINUTES

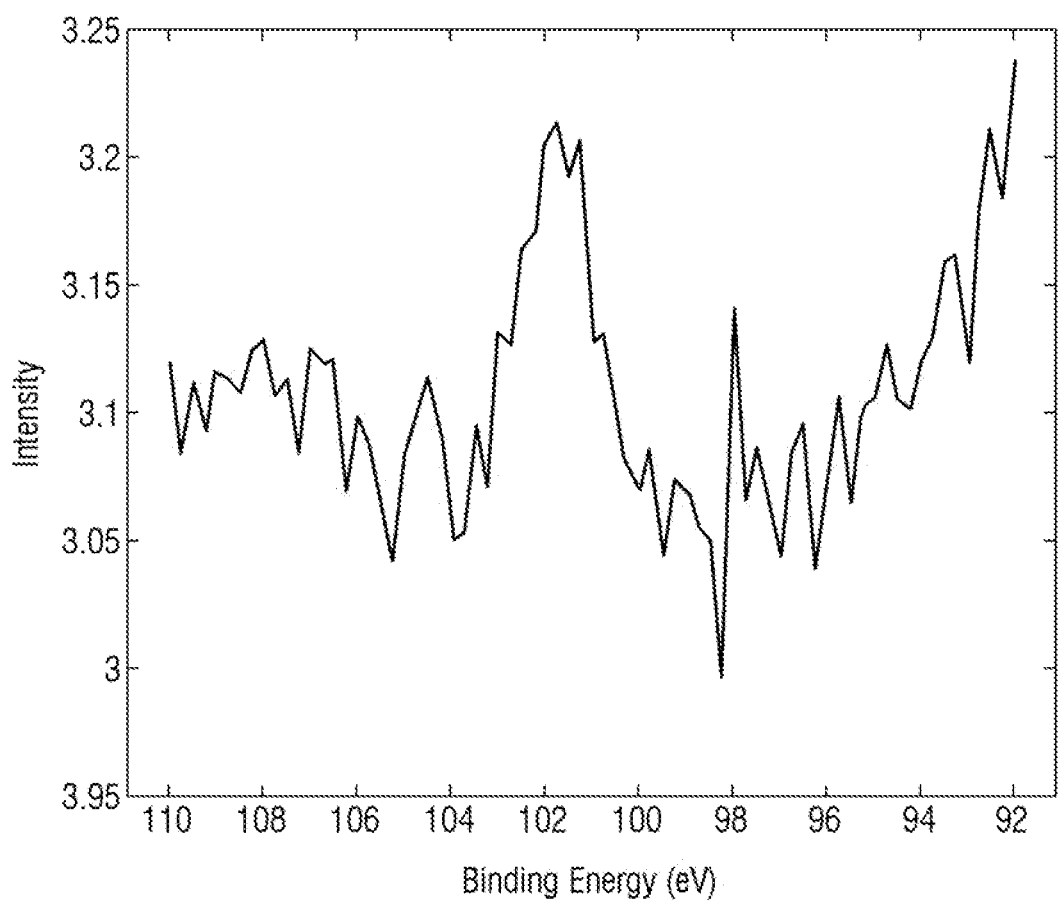

FIRST SURFACE HEAT TREATMENT FOUR MINUTES

SEMICONDUCTOR DEVICE MANUFACTURING METHOD

CROSS-REFERENCE TO RELATED APPLICATION

This application claims priority from Korean Patent Application No. 10-2022-0015372 filed on Feb. 7, 2022, in the Korean Intellectual Property Office, and all the benefits accruing therefrom under 35 U.S.C. 119, the contents of which in its entirety are herein incorporated by reference.

BACKGROUND

1. Field

Embodiments relate to semiconductor device manufacturing method.

2. Description of the Related Art

In recent years, functions of semiconductor devices have been dramatically developed with rapid spread of information media. In the case of recent semiconductor products, a low cost is desired to secure competitiveness and a high integration of product is desired for a high quality. The semiconductor devices are being scaled down for the high integration.

On the other hand, as a pitch size decreases, a technique of electrically separating the integrated elements is emphasized and activated. Separation techniques used in scaled elements also call for ultra-miniaturization.

SUMMARY

Embodiments are directed to a semiconductor device manufacturing method including, providing a first layer having a first surface, providing a second layer including a trench that exposes the first surface, onto the first layer, forming a first polymer layer that fills the trench, and performing a heat treatment process on the first polymer layer to form a second polymer layer, wherein a second surface of the second layer is exposed by the trench, the first polymer layer includes a first portion being in contact with the first surface, and a second portion being in contact with the second surface, when the heat treatment process is performed, the first portion of the first polymer layer is decomposed, when the heat treatment process is performed, the second portion of the first polymer layer is cross-linked to form the second polymer layer, and physical properties of the first layer are different from physical properties of the second layer.

Embodiments are directed to a semiconductor device manufacturing method including, forming a gap fill insulating layer on a titanium nitride layer, etching the gap fill insulating layer to form a trench, forming a polyurea layer that fills the trench, and performing a heat treatment process on the polyurea layer to form a polymer layer, wherein the trench exposes side walls of the gap fill insulating layer and an upper surface of the titanium nitride layer, the polyurea layer includes a first portion being in contact with the upper surface of the titanium nitride layer, and a second portion being in contact with the side walls of the gap fill insulating layer, when the heat treatment process is performed, the first portion of the polyurea layer is decomposed, when the heat treatment process is performed, the gap fill insulating layer generates hydrogen ions, when the heat treatment process is performed, the second portion of the polyurea layer reacts with the hydrogen ions and is cross-linked to form the polymer layer, and the polyurea layer includes a substance represented by the following Chemical Formula 1.

[Chemical Formula 1]

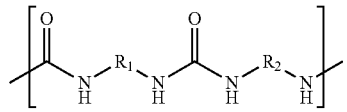

In Chemical Formula 1, R1 is a substituted or unsubstituted alkyl group having 2 to 8 carbon atoms, or a substituted or unsubstituted benzene group, and R2 is a substituted or unsubstituted alkyl group having 2 to 8 carbon atoms, an alkylamino group having 4 to 6 carbon atoms, or a substituted or unsubstituted benzene group.

Embodiments are directed to a semiconductor device manufacturing method including, providing a substrate including a first region and a second region, forming a first sheet pattern on the substrate of the first region, forming a second sheet pattern on the substrate of the second region, forming a work function metal layer that wraps around the first sheet pattern and the second sheet pattern, on the substrate, forming a sacrificial layer that covers the first and second sheet patterns, on the substrate, forming a trench penetrating the sacrificial layer between the first sheet pattern and the second sheet pattern, forming a first polymer layer that fills the trench, and forming a second polymer layer through a heat treatment process, wherein the trench exposes an upper surface of the work function metal layer and side walls of the sacrificial layer, the first polymer layer includes a first portion being in contact with the upper surface of the work function metal layer, and a second portion being in contact with side walls of the sacrificial layer, the first portion of the first polymer layer is decomposed through the heat treatment process, and the second portion of the first polymer layer is cross-linked through the heat treatment process to form the second polymer layer, and the work function metal layer includes titanium nitride.

BRIEF DESCRIPTION OF THE DRAWINGS

Features will become apparent to those of skill in the art by describing in detail example embodiments with reference to the attached drawings in which:

FIGS. 8A and 8B are graphs obtained by analyzing a first surface and a second surface, using X-ray Photoelectron Spectroscopy (XPS) before an inhibitor treatment.

FIGS. 10A and 10B are graphs obtained by analyzing a first surface and a second surface using X-ray Photoelectron Spectroscopy (XPS), after an inhibitor layer treatment was performed for 3 minutes.

FIGS. 11A and 11B are graphs obtained by analyzing a first surface and a second surface using X-ray Photoelectron Spectroscopy (XPS) after a heat treatment process was performed for 1 minute.

DETAILED DESCRIPTION

Hereinafter, a semiconductor device manufacturing method according to some example embodiments will be described referring to FIGS. 1 to 5.

Figure 1:
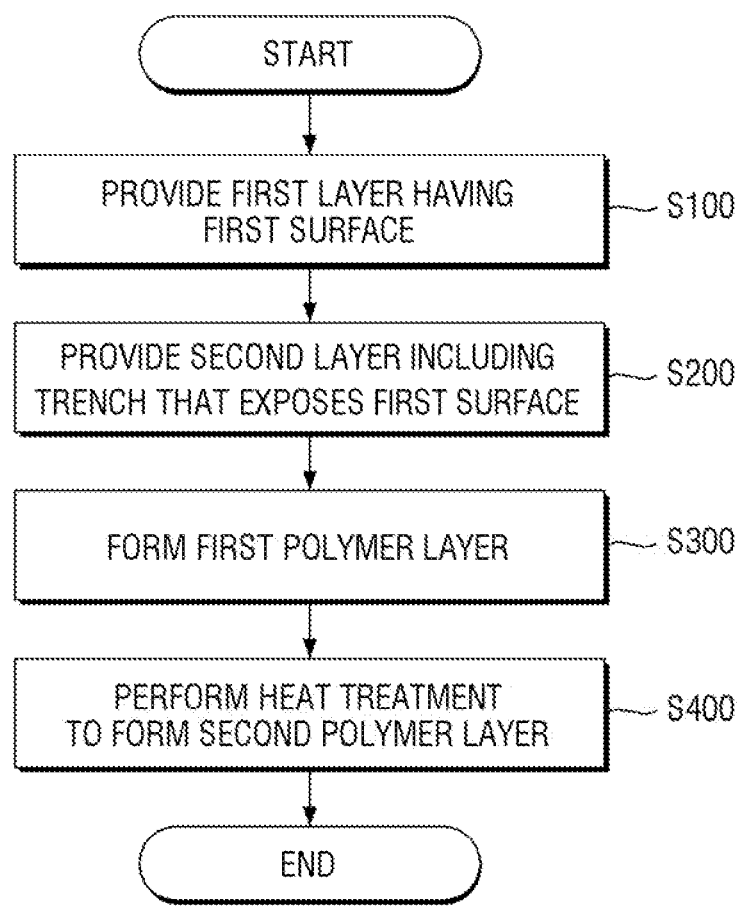
FIG. 1 is an example flowchart for explaining the semiconductor device manufacturing method according to some example embodiments.

FIG. 1 is an example flowchart for explaining a semiconductor device manufacturing method according to some example embodiments. FIGS. 2 to 5 are intermediate step diagrams for explaining a semiconductor device manufacturing method according to some example embodiments.

Figure 2:
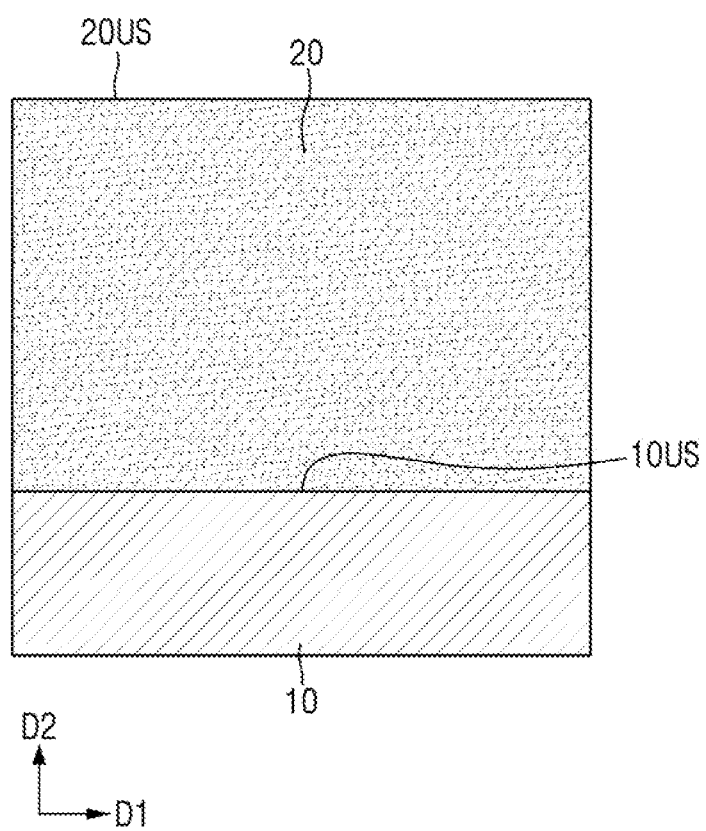
FIGS. 2 to 5 are intermediate step diagrams for explaining the semiconductor device manufacturing method according to some example embodiments.

Referring to FIGS. 1 and 2, a first layer 10 having a first surface 10US may be provided (S100).

The first layer 10 may be a titanium nitride layer. For example, the first layer 10 may include, e.g., titanium nitride (TiN), an organic polymer, or a combination thereof.

The first layer 10 may include the first surface 10US. For example, the first surface 10US may be an upper surface of the first layer 10.

A second layer 20 may be provided on the first layer 10. The second layer 20 may cover the upper surface of the first layer 10. The second layer 20 may be a gap fill insulating layer. The second layer 20 may be, e.g., a dry etch resistance layer or a wet etch resistance layer.

Figure 3:
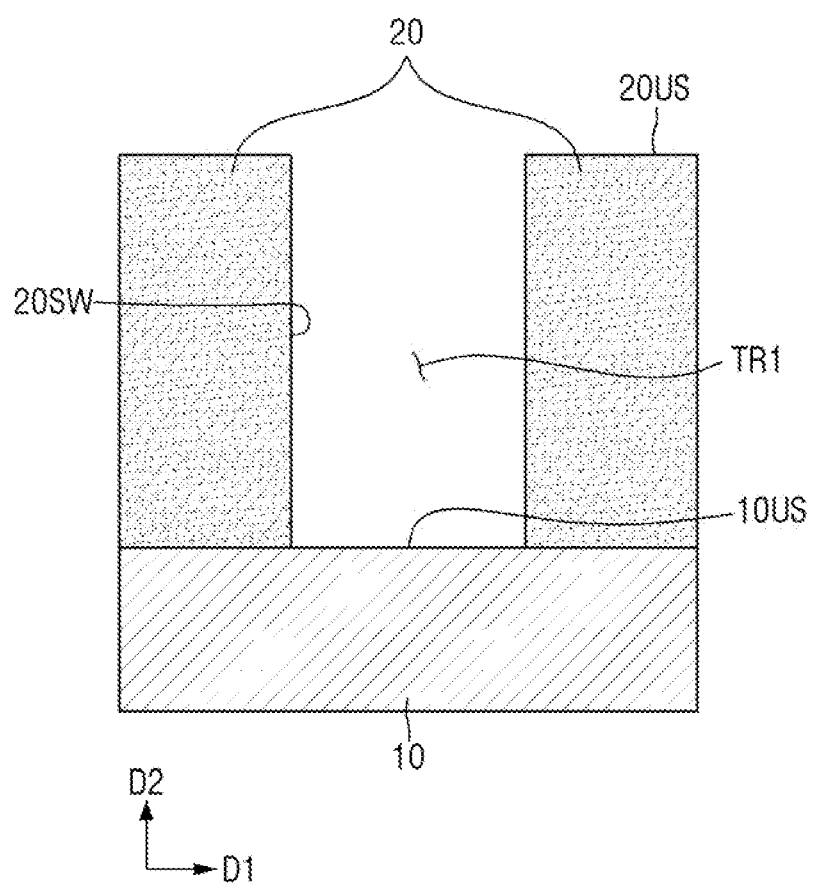

Referring to FIGS. 1 and 3, a first trench TR1 that penetrates the second layer 20 and exposes the first surface 10US of the first layer 10 may be formed. The first surface 10US of the exposed first layer 10 may be a bottom surface of the first trench TR1. Thus, the second layer 20 including the first trench TR1 that exposes the first surface 10US may be provided (S200).

The second layer 20 may be etched in a second direction D2 to form the first trench TR1. The first trench TR1 may expose a second surface 20SW of the second layer 20. The second surface 20SW of the second layer 20 may be a side wall of the second layer 20 or a side wall of the first trench TR1.

In some example embodiments, the first surface 10US of the first layer 10 may extend in the first direction D1, and the second surface 20SW of the second layer 20 may extend in the second direction D2. The first direction D1 and the second direction D2 may intersect each other. The first direction D1 and the second direction D2 may be substantially perpendicular to each other.

The first surface 10US of the first layer 10 may include a hydroxy group or an amine group through a surface pretreatment process, e.g., a dry etching process, a wet etching process, a wet cleaning process, etc. Further, the first surface 10US of the first layer 10 may include a metal or a combination of a metal and an organic polymer. For example, the first surface 10US of the first layer 10 may include a combination of titanium nitride (TiN) and an organic polymer, and may include a hydroxyl group or an amine group through the dry etching process, the wet etching process, the wet cleaning process, etc.

The second layer 20 may include an acid-precursor. When a stimulus such as heat, light or an electromagnetic wave is applied to the second layer 20, the second layer 20 may generate acid or hydrogen ions ($H^+$). The second surface 20SW of the second layer 20 may include a hydroxy group or an amine group through the surface pretreatment process, e.g., the dry etching process, the wet etching process, the wet cleaning process, etc.

Figure 4:
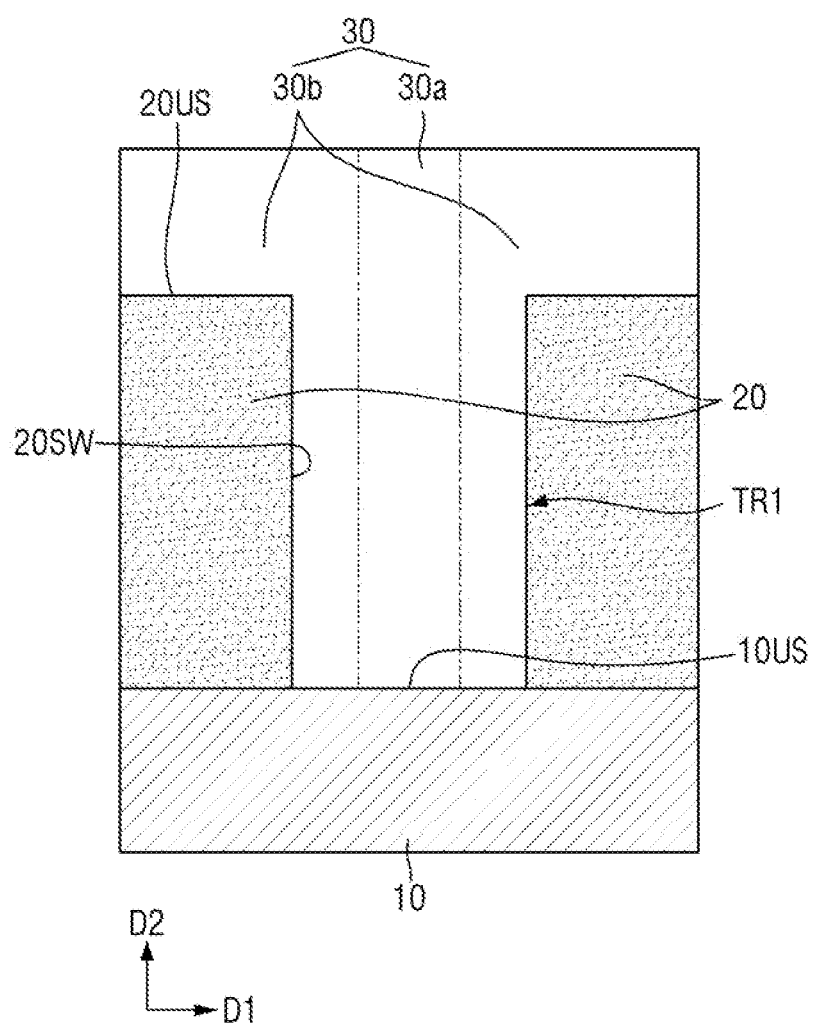

Referring to FIGS. 1 and 4, a first polymer layer 30 may be formed (S300). The first polymer layer 30 may fill the first trench TR1. The first polymer layer 30 may cover the first surface 10US of the first layer 10, the second surface 20SW of the second layer 20, and an upper surface 20US of the second layer 20. The first polymer layer 30 may cover the first layer 10 and the second layer 20.

The first polymer layer 30 may be formed at a temperature of 0° C. or higher and 120° C. or lower. The first polymer layer 30 may be vapor-deposited at a temperature of 0° C. or higher and 120° C. or lower, using a chemical vapor deposition (CVD) or an atomic layer deposition (ALD). The temperature of 0° C. or higher and 120° C. or lower may be a temperature at which the second layer 20 does not generate acid or hydrogen ions ($H^+$). The temperature of 0° C. or higher and 120° C. or lower may be a temperature at which the first polymer layer 30 is not decomposed. The temperature of 0° C. or higher and 120° C. or lower may be lower than a melting point of the first polymer layer 30.

In some example embodiments, the first polymer layer 30 may include a first portion 30a and a second portion 30b. The first portion 30a may be a portion that is in contact with the first surface 10US of the first layer 10. The second portion 30b may be a portion that is in contact with the second surface 20SW of the second layer 20 and the upper surface 20US of the second layer 20. The first portion 30a may be provided between adjacent second portions 30b.

In some example embodiments, the first polymer layer 30 may include a polyurea layer. For example, the first polymer layer 30 may include a substance represented by Chemical Formula 1.

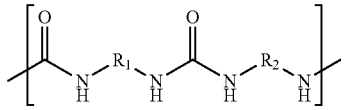

[Chemical Formula 1]

In Chemical Formula 1, $R_1$ may be a substituted or unsubstituted alkyl group having 2 to 8 carbon atoms, or a substituted or unsubstituted benzene group, and $R_2$ may be a substituted or unsubstituted alkyl group having 2 to 8 carbon atoms, an alkylamino group having 4 to 6 carbon atoms, or a substituted or unsubstituted benzene group.

In some example embodiments, the first polymer layer 30 may be formed by reaction of a first precursor with a second precursor. The first precursor may include, e.g., a primary amine substance. The second precursor may include, e.g., a diisocyanate substance.

The first precursor may include a substance represented by Chemical Formula 2.

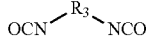

[Chemical Formula 2]

In Chemical Formula 2, $R_3$ may be a substituted or unsubstituted alkyl group having 2 to 8 carbon atoms, or a substituted or unsubstituted benzene group.

For example, the first precursor may include, e.g., at least one of ethylene diisocyanate, trimethylene diisocyanate, tetramethylene diisocyanate, pentamethylene diisocyanate, hexamethylene diisocyanate, heptamethylene diisocyanate, octamethylene diisocyanate, phenyl diisocyanate, diphenylmethane 4,4'-diisocyanate, 4,4',4"-triphenylmethane triisocyanate, 1,4-diisocyanato-2-butene, and 1,4-diisocyanato-2-butyne.

The first precursor may include a double bond or a triple bond. For example, the first precursor may include at least one of 1,4-diisocyanato-2-butene, and 1,4-diisocyanato-2-butyne.

The second precursor may include a substance represented by Chemical Formula 3.

[Chemical Formula 3]

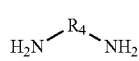

In Chemical Formula 3, $R_4$ may be a substituted or unsubstituted alkyl group having 2 to 8 carbon atoms, an alkylamino group having 4 to 6 carbon atoms, or a substituted or unsubstituted benzene group.

The second precursor may include, e.g., at least one of ethylene diamine, trimethylene diamine, tetramethylene diamine, pentamethylene diamine, hexamethylene diamine, heptamethylene diamine, octamethylene diamine, diethylene triamine, benzene triamine, triethylene tetraamine, melamine, hexaamino benzene, polyethylene imine, 2-butene-1,4-diamine, and 2-butyne-1,4-diamine.

The second precursor may include a double bond or a triple bond. For example, the second precursor may include at least one of 2-butene-1,4-diamine and 2-butyne-1,4-diamine.

When the first and second precursors each include a double bond or a triple bond, further cross-linking may be easily performed.

Figure 5:
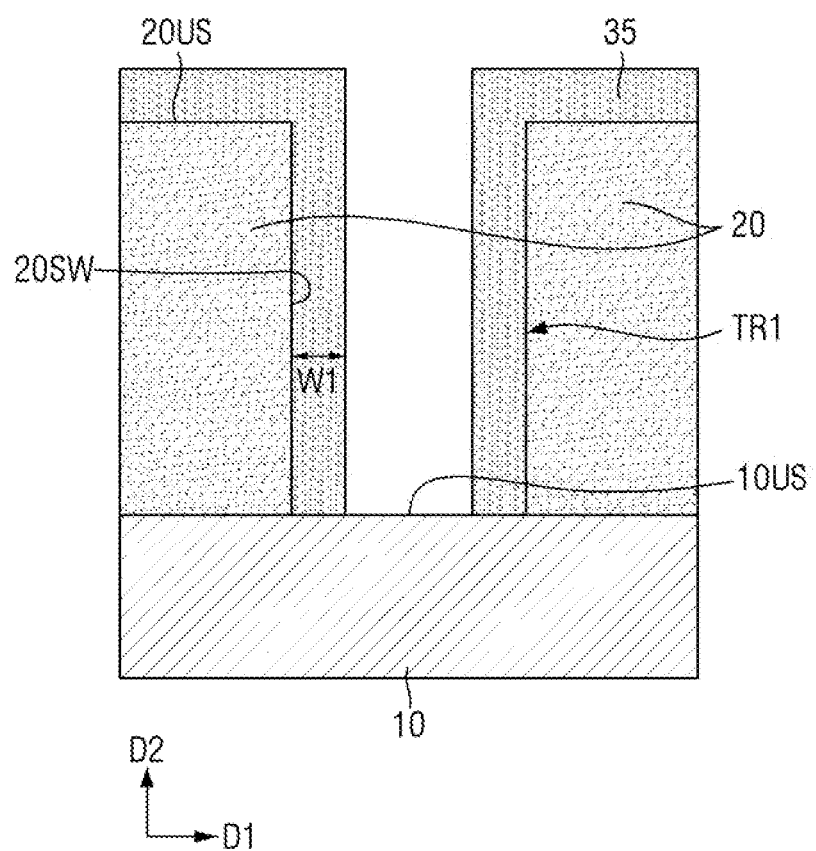

Referring to FIGS. 1 and 5, a second polymer layer 35 may be formed (S400). The second polymer layer 35 may be formed by performing a heat treatment process.

For example, the second polymer layer 35 may be formed by performing the heat treatment process on the first polymer layer 30. When the heat treatment process is performed, the first polymer layer 30 may be cross-linked to form the second polymer layer 35. When the heat treatment process is performed, the second layer 20 may generate hydrogen ions ($H^+$). The first polymer layer 30 may react with the generated hydrogen ions ($H^+$) and be cross-linked with the substance on the second layer 20. The second polymer layer 35 may be formed by the cross-linking.

The second polymer layer 35 may be formed on the surface of the second layer 20. The second polymer layer 35 may be formed on the second surface 20SW of the second layer 20 and the upper surface 20US of the second layer 20. The second polymer layer 35 may be formed to have a very thin thickness. For example, a width W1 of the second polymer layer 35 in the first direction D1 may be 10 nm or less or, e.g., 5 nm or less.

In an example embodiment, the second polymer layer 35 may not be formed on the first surface 10US of the first layer 10. For example, the first layer 10 may not generate hydrogen ions ($H^+$) even when the heat treatment process is performed, and thus the first polymer layer 30 that is in contact with the first surface 10US of the first layer 10 may not become cross-linked. When the heat treatment process is performed, the first polymer layer 30 that is in contact with the first surface 10US of the first layer 10 may be decomposed. Thus, the heat treatment process may be performed to selectively form the second polymer layer 35 on the surface of the second layer 20.

The heat treatment process may be performed at a temperature of 150° C. or higher and 250° C. or lower. The heat treatment process may be performed for a time of 1 minute or more and 4 minutes or less. The temperature of 150° C. or higher and 250° C. or lower may be a temperature at which the first polymer layer 30 may be decomposed, and a temperature at which hydrogen ions ($H^+$) are generated on the second layer 20. The heat treatment process may be performed at, e.g., a temperature of 240° C.

As described above, the first polymer layer 30 may be subjected to the heat treatment process and, as a result, the first polymer layer 30 on the first surface 10US (that is, the first portion 30a of the first polymer layer 30) may be decomposed while the first polymer layer 30 on the second surface 20SW (that is, the second portion 30b of the first polymer layer 30) may be cross-linked.

According to some example embodiments, the second polymer layer 35 may be selectively formed on the second surface 20SW due to the different physical properties of the first layer 10 and the second layer 20. When the heat treatment process is performed, hydrogen ions ($H^+$) may be generated inside the second layer 20, and the generated hydrogen ions ($H^+$) may react with the second surface 20SW of the second layer 20 and the first polymer layer 30 on the upper surface 20US of the second layer 20. The first polymer layer 30 may include a substance that is cross-linked by acid or hydrogen ions ($H^+$) and, thus, when the first polymer layer 30 reacts with hydrogen ions ($H^+$), the first polymer layer 30 may be cross-linked to form the second polymer layer 35.

On the other hand, even if the heat treatment process is performed, hydrogen ions ($H^+$) may not be generated inside the first layer 10 and, thus, the first polymer layer 30 on the first surface 10US of the first layer 10 may not be reacted with hydrogen ions ($H^+$). As a result, the first portion 30a of the first polymer layer 30 may not be cross-linked. The first portion 30a of the first polymer layer 30 may be decomposed when the heat treatment process is performed.

The surface of the second layer 20 may include a hydroxyl group. The second layer 20 may be a polymer layer including the hydroxy group. The polymer layer including the hydroxy group may be cross-linked with the polyurea layer.

As an example, when the surface of the second layer 20 includes a substance represented by Chemical Formula 4, it may be cross-linked with the first polymer layer 30 represented by Chemical Formula 1. The substance represented by Chemical Formula 4 may be cross-linked with the first polymer layer 30 represented by Chemical Formula 1 to form the second polymer layer 35. The second polymer layer 35 may include a substance represented by Chemical Formula 5.

As another example, when the surface of the second layer 20 includes a material different from Chemical Formula 4, the second polymer layer 35 may include a material different from Chemical Formula 5.

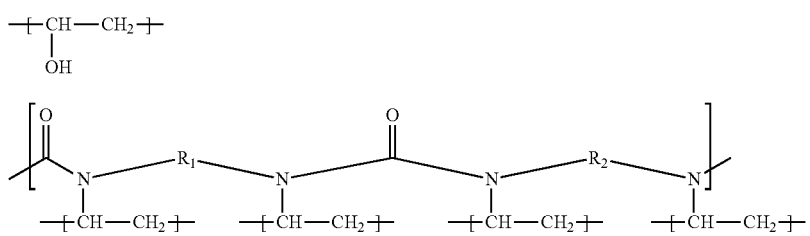

[Chemical Formula 4]

[Chemical Formula 5]

In Chemical Formula 5, $R_1$ is a substituted or unsubstituted alkyl group having 2 to 8 carbon atoms, or a substituted or unsubstituted benzene group, and $R_2$ is a substituted or unsubstituted alkyl group having 2 to 8 carbon atoms, an alkylamino group having 4 to 6 carbon atoms, or a substituted or unsubstituted benzene group.

In some example embodiments, when the first polymer layer 30 reacts with hydrogen ions ($H^+$), the second polymer layer 35 is formed, and carbon dioxide may be emitted. Further, when the first polymer layer 30 is decomposed by heat, no residue may be generated on the surface. Therefore, according to the present example embodiment, the second polymer layer 35 may be effectively selectively formed, using only the heat treatment process, and no residue may be generated.

As described above, the second polymer layer 35 may be formed to have a very thin thickness. As fabrication techniques develop or a pattern size is reduced, the width of the first trench TR1 in the first direction D1 may be made smaller. When the thickness of the second polymer layer 35 in the first direction D1 is thin, even if the width of the first trench TR1 in the first direction D1 is small, the second polymer layer 35 may be formed inside the first trench TR1. As a result, it may be possible to perform the subsequent process and manufacture a semiconductor device having improved reliability.

Hereinafter, physical properties of a polyurea layer according to some example embodiments will be described referring to FIGS. 6 and 7.

Figure 6:
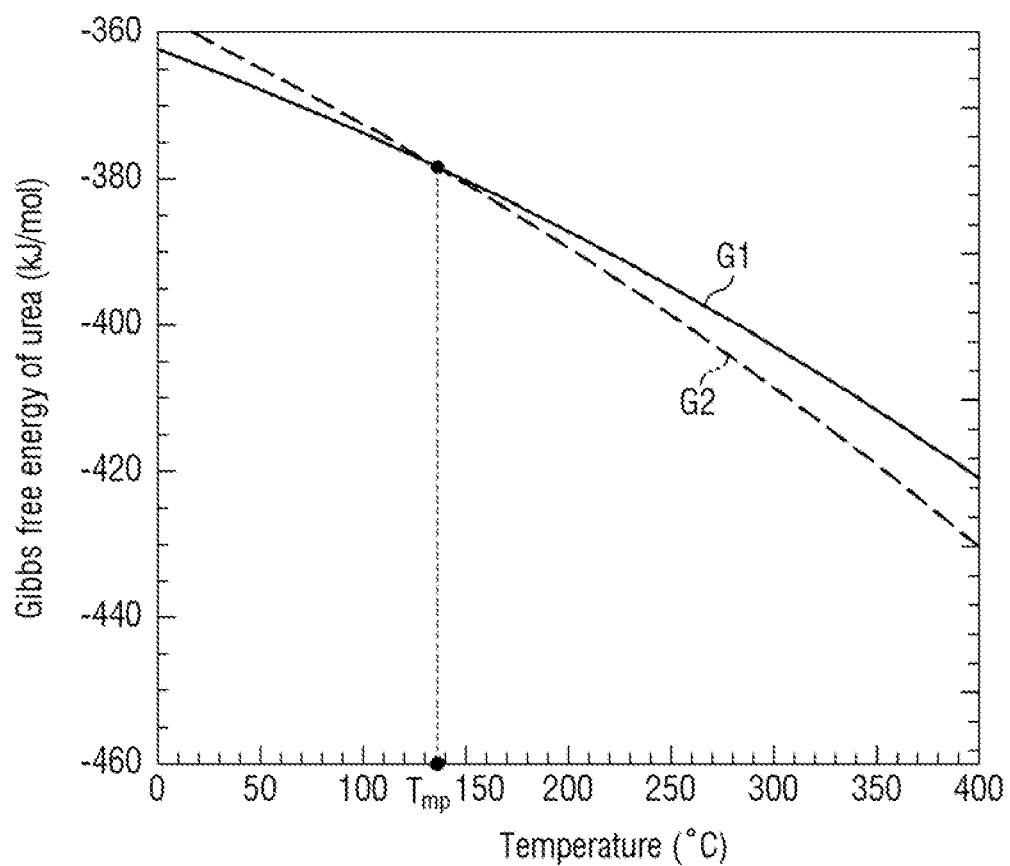
FIGS. 6 and 7 are example graphs for explaining the physical properties of a polyurea layer.
Figure 7:
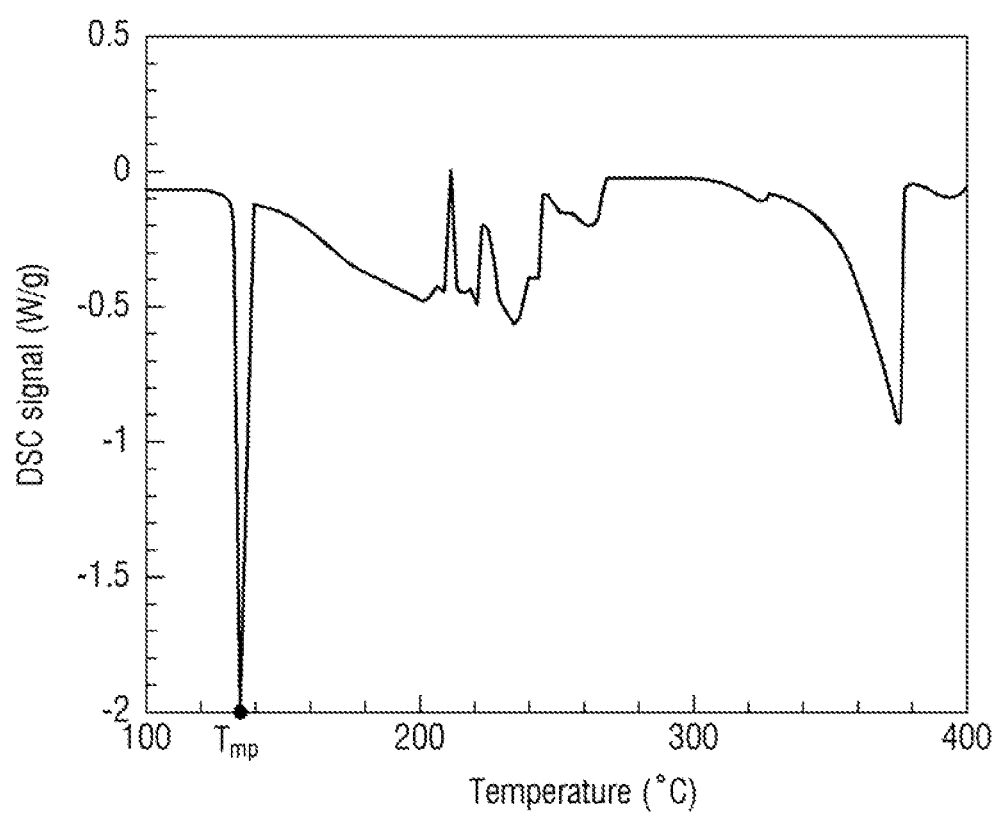

FIGS. 6 and 7 are example graphs for explaining the physical properties of the polyurea layer.

FIG. 6 is a graph showing a Gibbs free energy according to temperature of a polyurea layer. In FIG. 6, the x-axis is temperature, and the y-axis is the Gibbs free energy.

In FIG. 6, a first graph G1 shows the Gibbs free energy according to the temperature of a polyurea layer of a solid state. A second graph G2 shows the Gibbs free energy according to the temperature of a polyurea layer of a liquid state.

In general, a small Gibbs free energy may mean a more stable state.

Referring to FIG. 6, a polyurea layer may have a melting point at a first temperature $T_{mp}$. The first temperature $T_{mp}$ may be a point on which the first graph G1 and the second graph G2 meet or intersect. The first temperature $T_{mp}$ may be, e.g., 133° C.

For temperatures lower than the first temperature $T_{mp}$, the first graph G1 is located below the second graph G2. For the temperature lower than the first temperature $T_{mp}$, the Gibbs free energy of the polyurea layer of the solid state is smaller than the Gibbs free energy of the polyurea layer of the liquid state. That is, the section of temperature lower than the first temperature $T_{mp}$ may mean that the solid state is more stable than the liquid state. In other words, at the temperatures lower than the first temperature $T_{mp}$, the polyurea layer may be in the solid state.

For temperatures higher than the first temperature $T_{mp}$, the second graph G2 is located below the first graph G1. For the temperatures higher than the first temperature $T_{mp}$, the Gibbs free energy of the polyurea layer of the liquid state is smaller than the Gibbs free energy of the polyurea layer of the solid state. That is, the section of temperature higher than the first temperature $T_{mp}$ may mean that the liquid state is more stable than the solid state. In other words, at the temperatures higher than the first temperature $T_{mp}$, the polyurea layer may be in the liquid state.

At the first temperature $T_{mp}$, the first graph G1 and the second graph G2 intersect each other. At the first temperature $T_{mp}$, the Gibbs free energy of the liquid polyurea layer is equal to the Gibbs free energy of the solid polyurea layer. That is, the stability of the solid state and the stability of the liquid state are the same at the first temperature $T_{mp}$. That is, the melting point of the polyurea layer may be the first temperature $T_{mp}$.

FIG. 7 is a graph showing a DSC (Differential Scanning calorimeter) signal depending on temperature of a polyurea layer.

In FIG. 7, the x-axis is temperature, and the y-axis is the DSC signal.

The differential scanning calorimeter (DSC) is a method of measuring the difference in energy as a function of temperature, while changing the temperature of a substance to be measured and a reference substance according to a regulated program. That is, it is an analytical method of measuring the amount of heat flowing from a sample, while changing the temperature.

Referring to FIG. 7, it may be understood that the peak of the DSC signal is −2 at the first temperature $T_{mp}$. The peak of the DSC signal at the first temperature $T_{mp}$ may be convex below the peak of the DSC signal at other temperatures. This may mean that the amount of heat flowing from the polyurea layer is high at the first temperature $T_{mp}$. That is, the first temperature $T_{mp}$ may be the melting point of the polyurea layer. The first temperature $T_{mp}$ may be, e.g., 133° C.

Referring to FIGS. 6 and 7, the melting point of the polyurea layer may be about 133° C. Therefore, with reference to FIGS. 1 to 5, when the first polymer layer 30 includes the polyurea layer, the first polymer layer 30 may be formed at 133° C. or lower, and the first polymer layer 30 may be decomposed at higher than 133° C. Therefore, the first polymer layer 30 may be formed at a temperature of 0° C. or higher and 120° C. or lower. Also, the second polymer layer 35 may be formed at a temperature of 150° C. or higher (and, e.g., 250° C. or lower), e.g., while the first portion 30a of the first polymer layer 30 is decomposed so as to expose a portion the first surface 10US.

Hereinafter, experimental data of the semiconductor manufacturing method according to some example embodiments will be described referring to FIGS. 8A to 12B.

Graphs of FIGS. 8A to 12B are graphs for comparing physical properties of a first layer that includes titanium nitride (10 of FIG. 2) and a second layer that includes a gap fill insulating material (20 of FIG. 2), before and after treatment with an inhibitor that includes hexamethyldisilazane (HMDS).

The inhibitor includes hexamethyldisilazane (HMDS), which is a substance that is dissociated by acid or hydrogen ions ($H^+$). By treating the inhibitor on the first and second layers (10 and 20 of FIG. 2), then performing a heat treatment process, and then analyzing the inhibitor remaining on the first and second layers, the physical properties of the first and second layers are compared in FIGS. 8A to 12B.

FIGS. 8A and 8B are graphs obtained by analyzing a first surface (titanium nitride; 10US of FIG. 2) and a second surface (gap fill insulating material; 20SW of FIG. 2) using X-ray Photoelectron Spectroscopy (XPS) before treatment with an inhibitor (HMDS).

X-ray photoelectron spectroscopy (XPS) is an analytical technique for analyzing a surface of an analytical sample, and is an analytical method based on the theory of the photoelectric effect. A sample to be analyzed is irradiated with soft X-rays corresponding to tens to thousands of eV energy and having a relatively long wavelength among X-rays. In this case, strongly bonded core level electrons or weakly bonded valance level electrons are emitted from the surface layer atoms that form the analytical sample. The emitted electrons are called photoelectrons. In order for photoelectrons to be emitted, a kinetic energy has to exceed a binding energy and the work function of electrons. The binding energy of the electrons of the sample to be analyzed may be derived by measuring the kinetic energy of the emitted photoelectrons. Since the binding energy is an intrinsic energy of the element, the element of the analytical sample may be analyzed.

In the graphs of FIGS. 8A and 8B, the x-axis means a binding energy of the element, and the y-axis means a binding intensity.

The stronger the binding intensity is, the greater the number of bonds corresponding to that energy is. The binding energy of silicon (Si) is about 100 eV to 105 eV. Therefore, if the sample has a strong binding intensity in a binding energy range of about 100 eV to 105 eV, it may mean that the sample to be analyzed has a large number of silicon bonds.

Referring to FIG. 8A, there was no silicon (Si) on the first surface 10US prior to treating with the inhibitor. Referring to FIG. 8B, there was no silicon (Si) on the second surface 20SW prior to treating with the inhibitor. In other words, in FIGS. 8A and 8B, the binding intensity in the range of about 100 eV to 106 eV is not strong, which shows that there was no silicon (Si) on the first (10US) and second (20SW) surfaces before treating with the inhibitor.

Figure 9A:
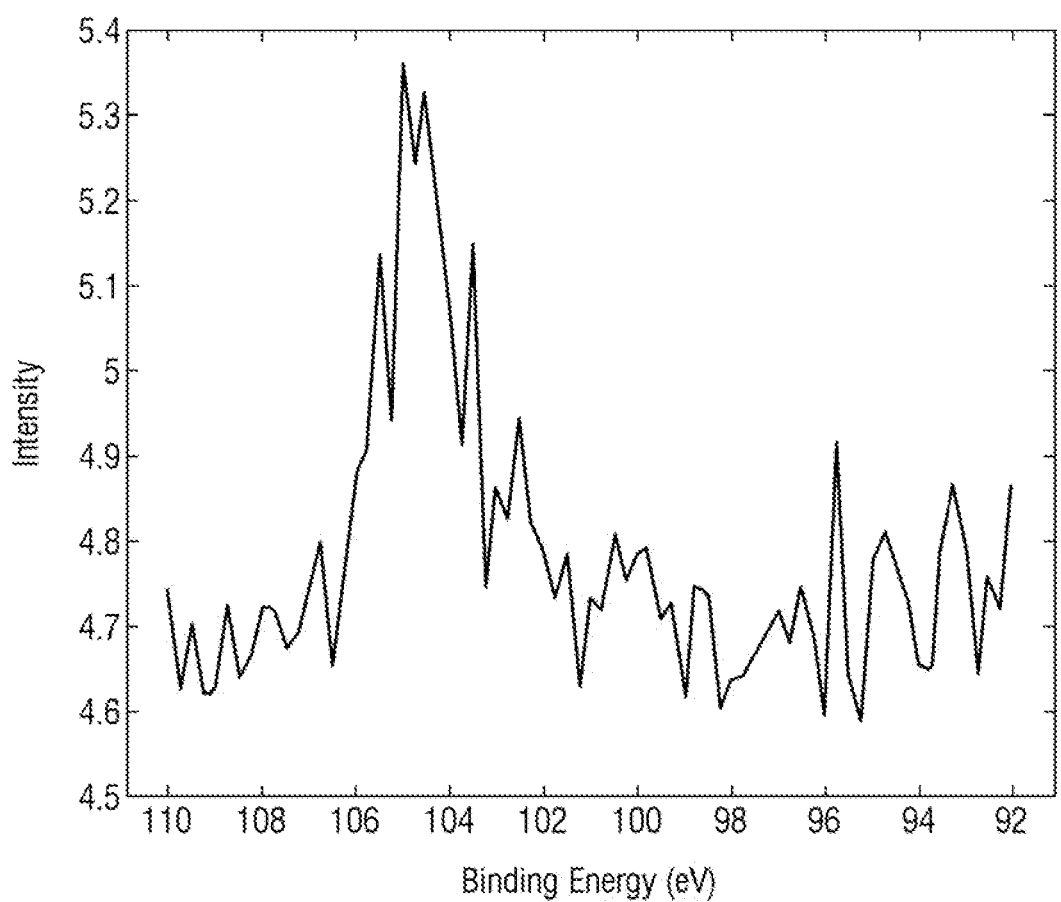
FIGS. 9A and 9B are graphs obtained by analyzing a first surface and a second surface, using X-ray Photoelectron Spectroscopy (XPS) after an inhibitor treatment was performed for 1 minute.
Figure 9B:
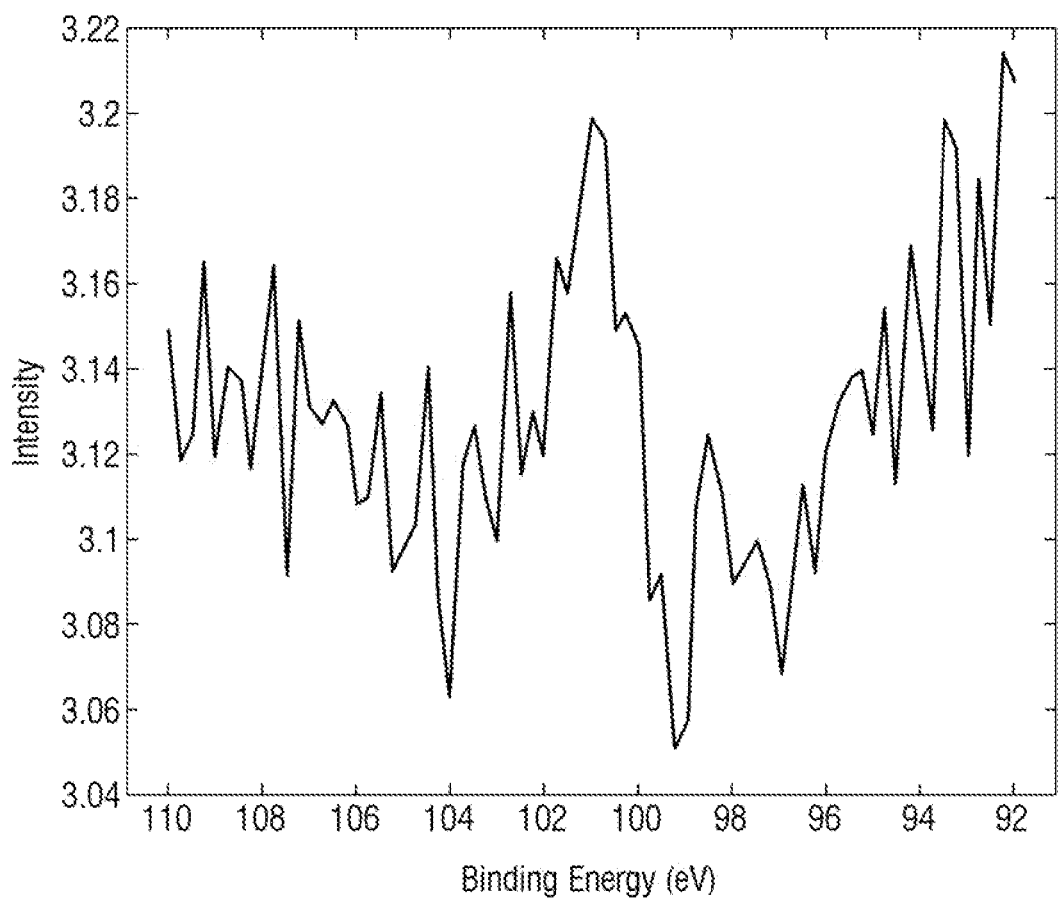

FIGS. 9A and 9B are graphs obtained by analyzing a first surface (titanium nitride; 10US of FIG. 2) and a second surface (gap fill insulating material; 20SW of FIG. 2) using X-ray Photoelectron Spectroscopy (XPS) after an inhibitor treatment (HMDS) was performed for 1 minute.

Referring to FIG. 9A, when the inhibitor treatment was performed for 1 minute, the inhibitor was formed on or reacted on the second surface 20SW. In FIG. 9A, the binding intensity is strongly shown at a binding energy of about 105 eV. That is, it may be understood that the number of silicon bonds on the second surface 20SW increased when the inhibitor treatment was performed on the second surface 20SW for 1 minute.

Referring to FIG. 9B, when the inhibitor layer treatment was performed for 1 minute, the inhibitor was formed on or reacted on the first surface 10US. In FIG. 9B, the binding intensity is strongly shown at a binding energy of about 101 eV. That is, it may be understood that the number of silicon bonds on the first surface 10US increased when the inhibitor treatment was performed on the first surface 10US for 1 minute.

Figure 10B:
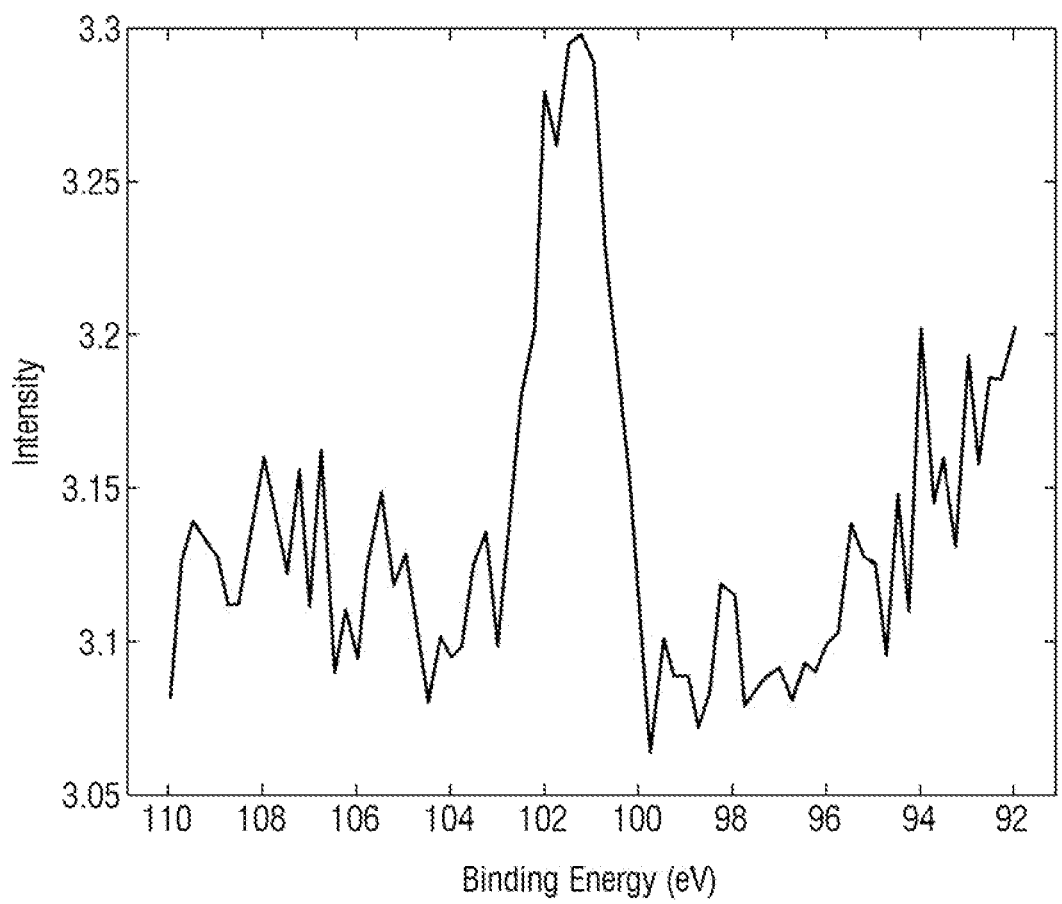

FIGS. 10A and 10B are graphs obtained by analyzing a first surface (titanium nitride; 10US of FIG. 2) and a second surface (gap fill insulating material; 20SW of FIG. 2) using X-ray Photoelectron Spectroscopy (XPS), after an inhibitor treatment (HMDS) was performed for 3 minutes.

Referring to FIGS. 9A and 10A relating to the second surface (gap fill insulating material; 20SW of FIG. 2), it may be understood that the binding intensity at a binding energy of about 105 eV when performing the inhibitor treatment on the second surface for 3 minutes (FIG. 10A) increased compared to the binding intensity at the binding energy of about 105 eV when performing the inhibitor treatment on the second surface for 1 minute (FIG. 9A). Specifically, when the inhibitor treatment was performed for 1 minute, the binding intensity at the binding energy of about 105 eV was about 5.35 (FIG. 9A), and when the inhibitor treatment was performed for 3 minutes, the binding intensity at the binding energy of 105 eV was about 5.6 (FIG. 10A). That is, the longer the inhibitor treatment time becomes, the greater the number of silicon bonds on the second surface becomes.

Referring to FIGS. 9B and 10B relating to the first surface (titanium nitride; 10US of FIG. 2), it may be understood that the binding intensity at a binding energy of about 101 eV when performing the inhibitor treatment on the first surface for 3 minutes (FIG. 10B) increased compared to the binding intensity at the binding energy of about 101 eV when performing the inhibitor treatment on the first surface for 1 minute (FIG. 9B). Specifically, when the inhibitor treatment was performed for 1 minute, the binding intensity at the binding energy of 101 eV was about 3.2 (FIG. 9B), and when the inhibitor treatment was performed for 3 minutes, the binding intensity at the binding energy of 101 eV was about 3.3 (FIG. 10B). That is, the longer the inhibitor treatment time becomes, the greater the number of silicon bonds on the first surface becomes.

Figure 11A:
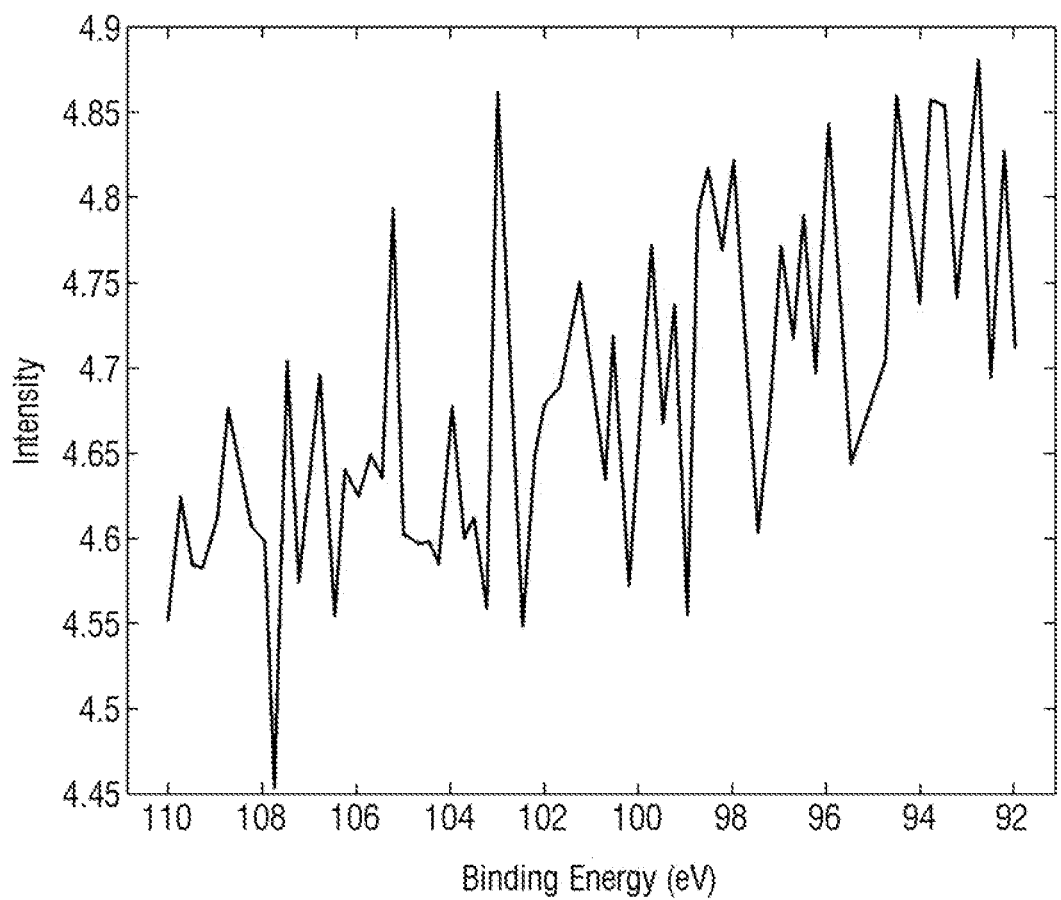

FIGS. 11A and 11B are graphs obtained by analyzing a first surface (titanium nitride; 10US of FIG. 2) and a second surface (gap fill insulating material; 20SW of FIG. 2) using X-ray Photoelectron Spectroscopy (XPS) after a heat treatment process was performed for 1 minute.

Referring to FIG. 11A, when the heat treatment process was performed on the second surface for 1 minute, the binding intensity at a binding energy of about 105 eV decreased. That is, when the heat treatment process was performed on the second surface for 1 minute, the inhibitor on the second surface was removed. On the other hand, referring to FIG. 11B, even though the heat treatment process was performed on the first surface for 1 minute, the binding intensity at the binding energy of 101 eV did not decrease. That is, even though the heat treatment process was performed on the first surface for 1 minute, the inhibitor on the first surface was not removed. Thus, when the heat treatment process is performed, the inhibitor on the first surface may not be removed, and only the inhibitor on the second surface may be selectively removed.

As described above, the inhibitor includes a substance that is dissociated by acid or hydrogen ions (H$^+$). The removal of the inhibitor on the second surface when the heat treatment process is performed may mean that the second layer generates hydrogen ions (H$^+$) when the heat treatment process is performed. On the other hand, the fact that the inhibitor on the first surface is not removed even when the heat treatment process is performed may mean that the first layer does not generate hydrogen ions (H$^+$) even when the heat treatment process is performed. Thus, the first layer and the second layer may be determined to have different physical properties from each other.

As described above, the first layer may not generate hydrogen ions (H$^+$) when the heat treatment process is performed, and the second layer may generate hydrogen ions (H$^+$) when the heat treatment process is performed. The second polymer layer (35 in FIG. 2) may be selectively formed on the second layer (20 in FIG. 2) by utilizing such physical properties.

Figure 12A:
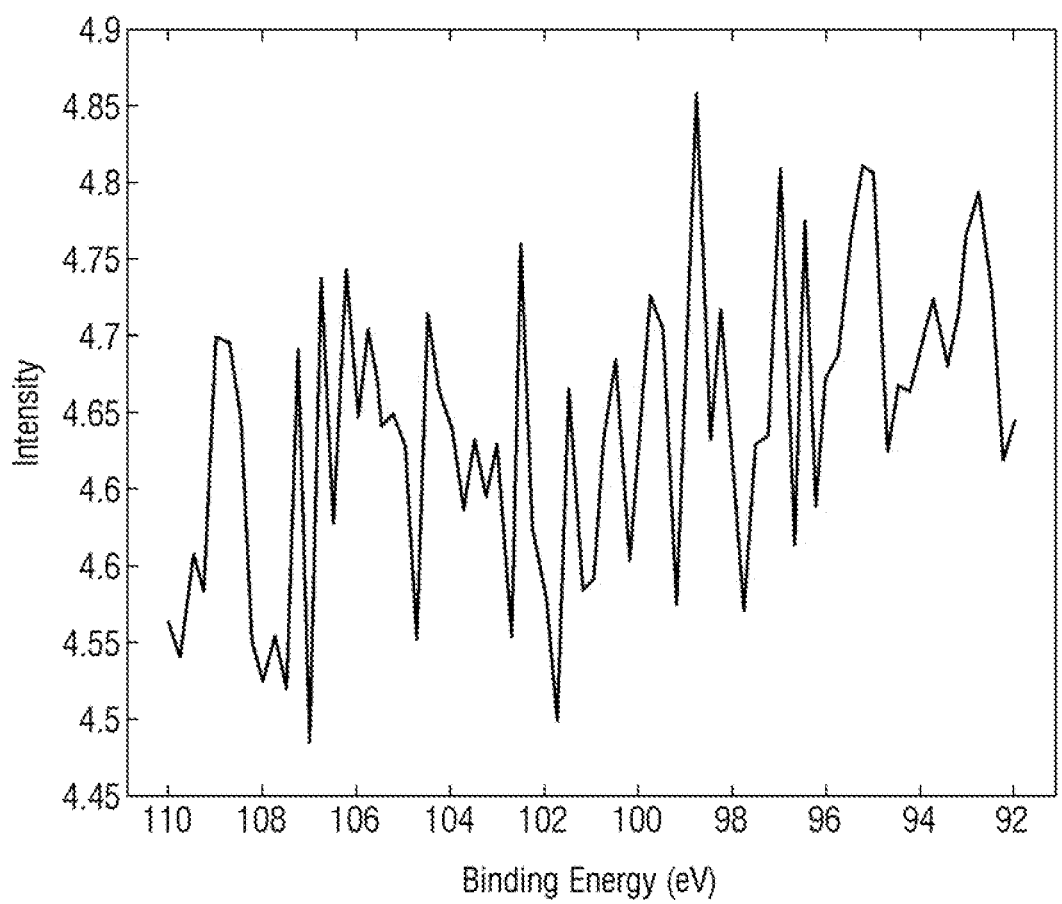
FIGS. 12A and 12B are graphs obtained by analyzing a first surface and a second surface using X-ray Photoelectron Spectroscopy (XPS) after a heat treatment process was performed for 4 minutes.
Figure 12B:
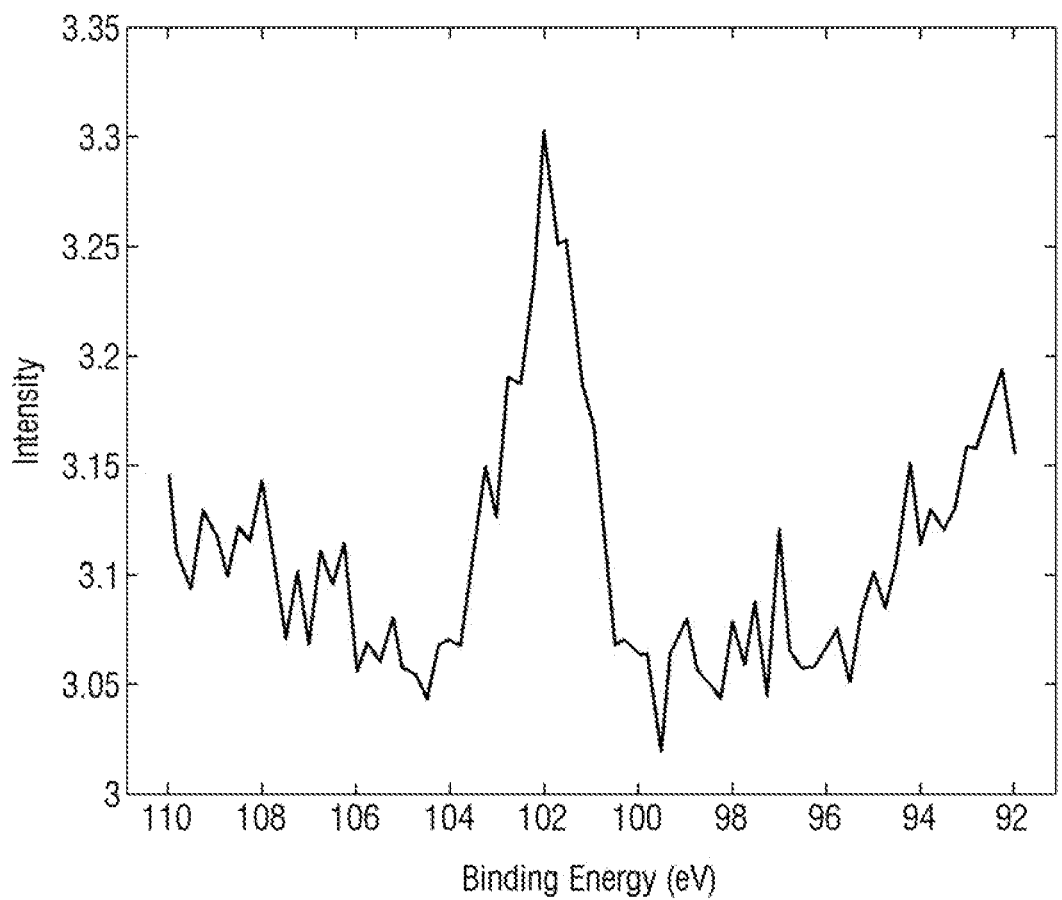

FIGS. 12A and 12B are graphs obtained by analyzing a first surface (titanium nitride; 10US of FIG. 2) and a second surface (gap fill insulating material; 20SW of FIG. 2) using X-ray Photoelectron Spectroscopy (XPS) after a heat treatment process was performed for 4 minutes.

Referring to FIG. 12A, when the heat treatment process was performed on the second surface for 4 minutes, the binding intensity at the binding energy of 105 eV was weak. That is, most of the inhibitor on the second surface may be removed.

Referring to FIG. 12B, even though the heat treatment process was performed on the first surface for 4 minutes, the binding intensity at the binding energy of 101 eV was not lessened. That is, even though the heat treatment process was performed on the first surface for 4 minutes, the inhibitor on the first surface was not removed.

In some example embodiments, a heat treatment process may be performed for 1 to 4 minutes to selectively decompose the first polymer layer on the first surface, and the first polymer layer on the second surface may be selectively cross-linked to form a second polymer layer.

Hereinafter, a method of manufacturing a semiconductor device according to some example embodiments will be described.

In the drawings relating to the semiconductor device to be described below, a transistor including nanowire or nanosheet, MBCFET™ (Multi-Bridge Channel Field Effect Transistor) is shown, as an example. However, a semiconductor device according to some example embodiments may include a fin-type transistor (FinFET) including a channel region of a fin-type pattern shape, a tunneling transistor (tunneling FET), a three-dimensional (3D) transistor, etc. The semiconductor device according to some example embodiments may include a planar transistor. In addition, example embodiments may be applied to a transistor based on two-dimensional material (2D material based FETs) and a heterostructure thereof. Further, the semiconductor device according to some example embodiments may also include a bipolar junction transistor, a laterally diffused metal oxide semiconductor (LDMOS), etc.

FIGS. 13 to 24 are intermediate diagrams for explaining a method of manufacturing a semiconductor device according to some example embodiments.

Figure 13:
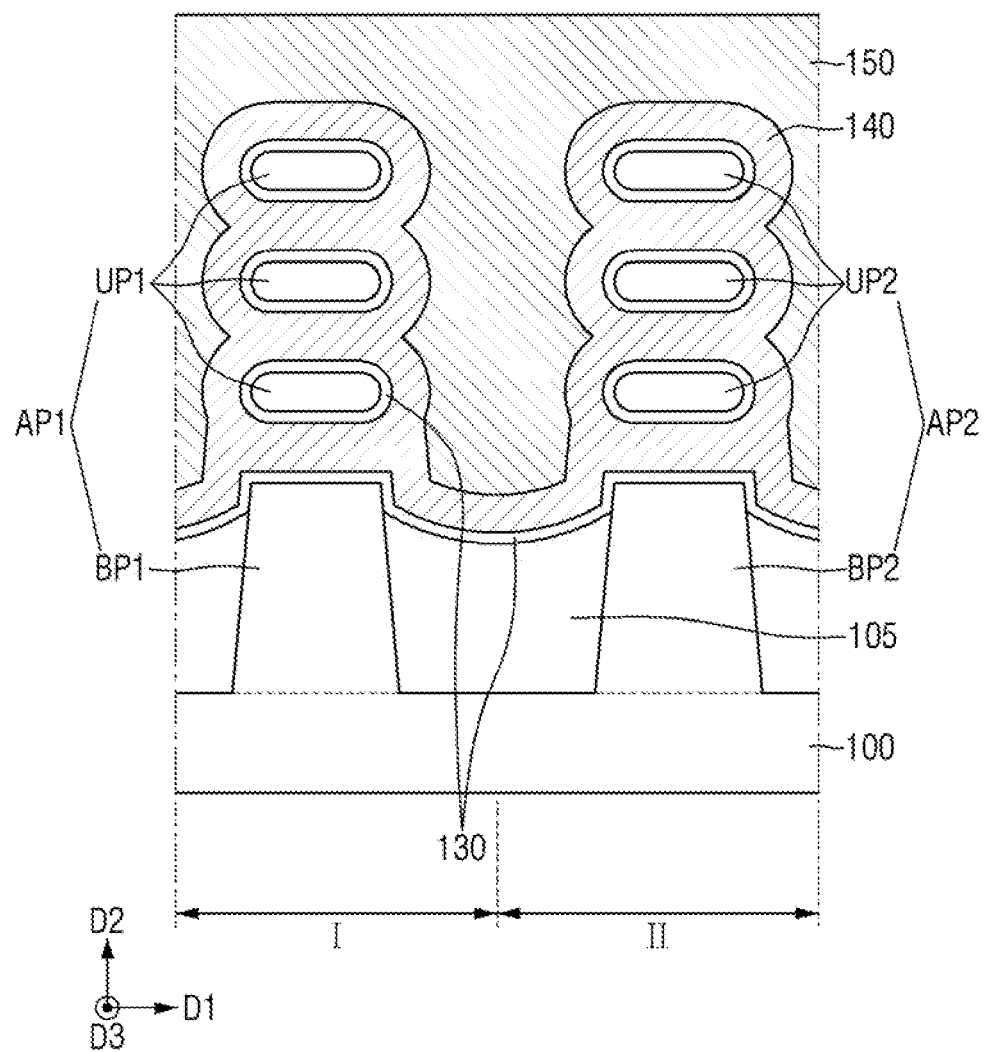
FIGS. 13 to 24 are intermediate diagrams for explaining a method of manufacturing a semiconductor device according to some example embodiments.

Referring to FIG. 13, a substrate 100 is provided. The substrate 100 may include a first region I and a second region II. The first region I and the second region II may be regions adjacent to each other, or may be regions spaced apart from each other.

The substrate 100 may be a silicon substrate or an SOI (silicon-on-insulator). In another implementation, the substrate 100 may include, e.g., silicon germanium, SGOI (silicon germanium on insulator), indium antimonide, lead tellurium compounds, indium arsenide, indium phosphide, gallium arsenide or gallium antimonide.

Although not shown, the substrate 100 may include an active region and a field region. The field region may be formed between the active regions. That is, the active regions may be separated by the field region. For example, an element isolation film may be placed around the active region. A portion in which the element isolation film is placed may be the field region.

For example, a portion in which a channel region of a transistor, which may be an example of the semiconductor device, is formed may be the active region, and a portion that divides the channel region of the transistor formed in the active region may be the field region. Alternatively, the active region may be a portion in which nanosheets or nanowires used as the channel region of the transistor are formed, and the field region may be a region in which the nanosheets or nanowires used as the channel region are not formed.

In some example embodiments, one of the first region I and the second region II may be a PMOS formation region, and the other thereof may be an NMOS formation region. In another example embodiment, both the first region I and the second region II may be the PMOS formation region. In another example embodiment, both the first region I and the second region II may be the NMOS formation region.

A first active pattern AP1 may be formed on the substrate 100 of the first region I. A second active pattern AP2 may be formed on the substrate of the second region II. The portion in which the first active pattern AP1 and the second active pattern AP2 are formed may be the active region.

The first active pattern AP1 may include a first lower pattern BP1 and a plurality of first sheet patterns UP1. The second active pattern AP2 may include a second lower pattern BP2 and a plurality of second sheet patterns UP2.

The first lower pattern BP1 and the second lower pattern BP2 may protrude from the substrate 100 in the second direction D2 and extend long in a third direction D3. The first lower pattern BP1 and the second lower pattern BP2 may be spaced apart from each other in the first direction D1. The first direction D1, the second direction D2, and the third direction D3 may intersect each other. The first direction D1, the second direction D2, and the third direction D3 may be substantially perpendicular to each other.

The first sheet pattern UP1 may be formed on the first lower pattern BP1. The first sheet pattern UP1 may be spaced apart from the first lower pattern BP1 in the second direction D2. The number of first sheet patterns UP1 may be at least one or more. Each first sheet pattern UP1 may be spaced apart from each other in the second direction D2.

The second sheet pattern UP2 may be formed on the second lower pattern BP2. The second sheet pattern UP2 may be spaced apart from the second lower pattern BP2 in the second direction D2. The number of the second sheet patterns UP2 may be at least one or more. Each of the second sheet patterns UP2 may be spaced apart from each other in the second direction D2.

Although the three first sheet patterns UP1 and second sheet patterns UP2 are each shown, this is only for convenience of explanation, and the number thereof may be varied.

Each of the first and second active patterns AP1 and AP2 may be a part of the substrate 100, and may include an epitaxial layer that is grown from the substrate 100. The first and second active patterns AP1 and AP2 may include, e.g., silicon or germanium, which are elemental semiconductor materials. Further, the first and second active patterns AP1 and AP2 may include a compound semiconductor, and may include, e.g., a group IV-IV compound semiconductor or a group III-V compound semiconductor. The group IV-IV compound semiconductor may include, e.g., a binary compound or a ternary compound including at least two or more of carbon (C), silicon (Si), germanium (Ge) and tin (Sn), or a compound obtained by doping these elements with a group IV element. The group III-V compound semiconductor may be, e.g., at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

In some example embodiments, the first and second active patterns AP1 and AP2 may include the same material. In other embodiments, the first and second active patterns AP1 and AP2 may include different materials from each other.

A field insulating film 105 may be formed between the first lower pattern BP1 and the second lower pattern BP2. The portion in which the field insulating film 105 is formed may be the field region. The first lower pattern BP1 and the second lower pattern BP2 may be interposed between the field insulating films 105. The field insulating film 105 may be formed on a part of the side surface of the first lower pattern BP1 and a part of the side surface of the second lower pattern BP2. The first and second lower patterns BP1 and BP2 may each protrude upward from the upper surface of the field insulating film 105. The field insulating film 105 may include, e.g., an oxide film, a nitride film, an oxynitride film, or a combination film thereof.

A gate insulating film 130 may be formed. The gate insulating film 130 may be formed on the upper surface of the field insulating film 105, the upper surface and a part of the side surface of the first lower pattern BP1, the upper surface and a part of the side surface of the second lower pattern BP2, the first sheet pattern UP1 and the second sheet pattern UP2. The gate insulating film 130 may wrap around the first sheet pattern UP1 and the second sheet pattern UP2.

The gate insulating film 130 may include silicon oxide, silicon oxynitride, silicon nitride, or a high dielectric constant material having a higher dielectric constant than that of silicon oxide. The high dielectric constant material may include, e.g., one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some example embodiments may include an NC (Negative Capacitance) FET that uses a negative capacitor. For example, the gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance value of the ferroelectric material film and the paraelectric material film connected in series may increase. By the use of the increased overall capacitance value, a transistor including the ferroelectric material film may have a subthreshold swing (SS) of less than 60 mV/decade at room temperature.

The ferroelectric material film may have ferroelectric properties. The ferroelectric material film may include, e.g., at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn).

The type of dopant included in the ferroelectric material film may vary, depending on which type of ferroelectric material is included in the ferroelectric material film.

When the ferroelectric material film includes hafnium oxide, the dopant included in the ferroelectric material film may include, e.g., at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include, e.g., at least one of a silicon oxide and a metal oxide having a high dielectric constant. The metal oxide included in the paraelectric material film may include, e.g., at least one of hafnium oxide, zirconium oxide, and aluminum oxide.

The ferroelectric material film and the paraelectric material film may include the same material. The ferroelectric material film has ferroelectric properties, but the paraelectric material film may not have ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, e.g., 0.5 to 10 nm. Since a critical thickness that exhibits the ferroelectric properties may change for each ferroelectric material, the thickness of the ferroelectric material film may change depending on the ferroelectric material.

In some example embodiments, the gate insulating film 130 may include one ferroelectric material film. In another example embodiment, the gate insulating film 130 may include a plurality of ferroelectric material films spaced apart from each other. The gate insulating film 130 may have a stacked film structure in which the plurality of ferroelectric material films and the plurality of paraelectric material films are alternately stacked.

A work function metal layer 140 may be formed on the substrate 100. The work function metal layer 140 may be formed on the gate insulating film 130. The work function metal layer 140 may wrap around the first and second sheet patterns UP1 and UP2. The work function metal layer 140 may include titanium nitride (TiN), an organic polymer, or a combination thereof. The work function metal layer 140 may include, e.g., a titanium nitride layer.

A protective layer 150 may be formed on the work function metal layer 140. The protective layer 150 may cover the work function metal layer 140. The material included in the protective layer 150 may be the same as the material included in the work function metal layer 140. For example, the protective layer 150 may include, e.g., a titanium nitride film.

Figure 14:
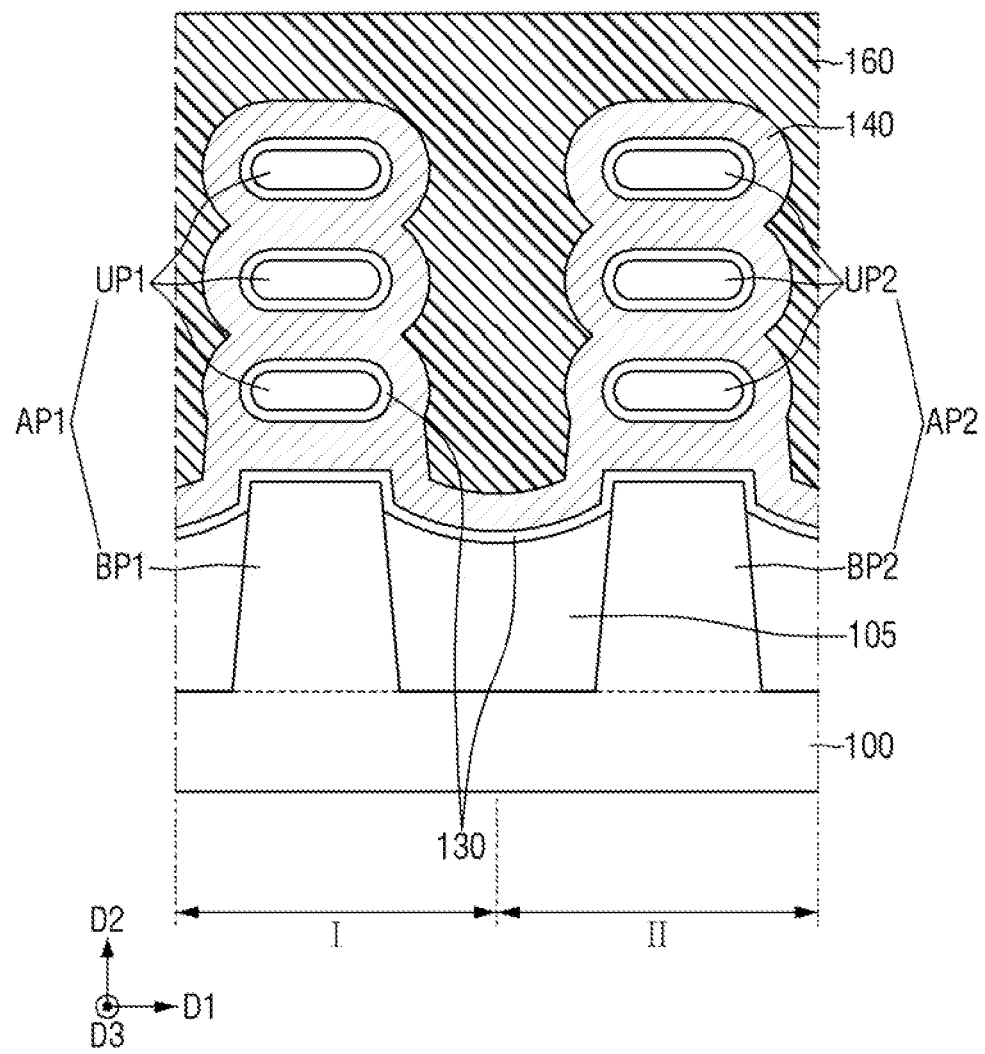

Referring to FIG. 14, a sacrificial layer 160 may be formed.

A gap fill insulating material may be deposited on the protective layer 150. The protective layer 150 and the gap fill insulating material may be combined to form the sacrificial layer 160. The sacrificial layer 160 may be, e.g., a material whose surface includes an acid-precursor. When a stimulus such as heat, light, or electromagnetic wave is applied to the sacrificial layer 160, the sacrificial layer 160 may emit acid or hydrogen ions ($H^+$).

Figure 15:
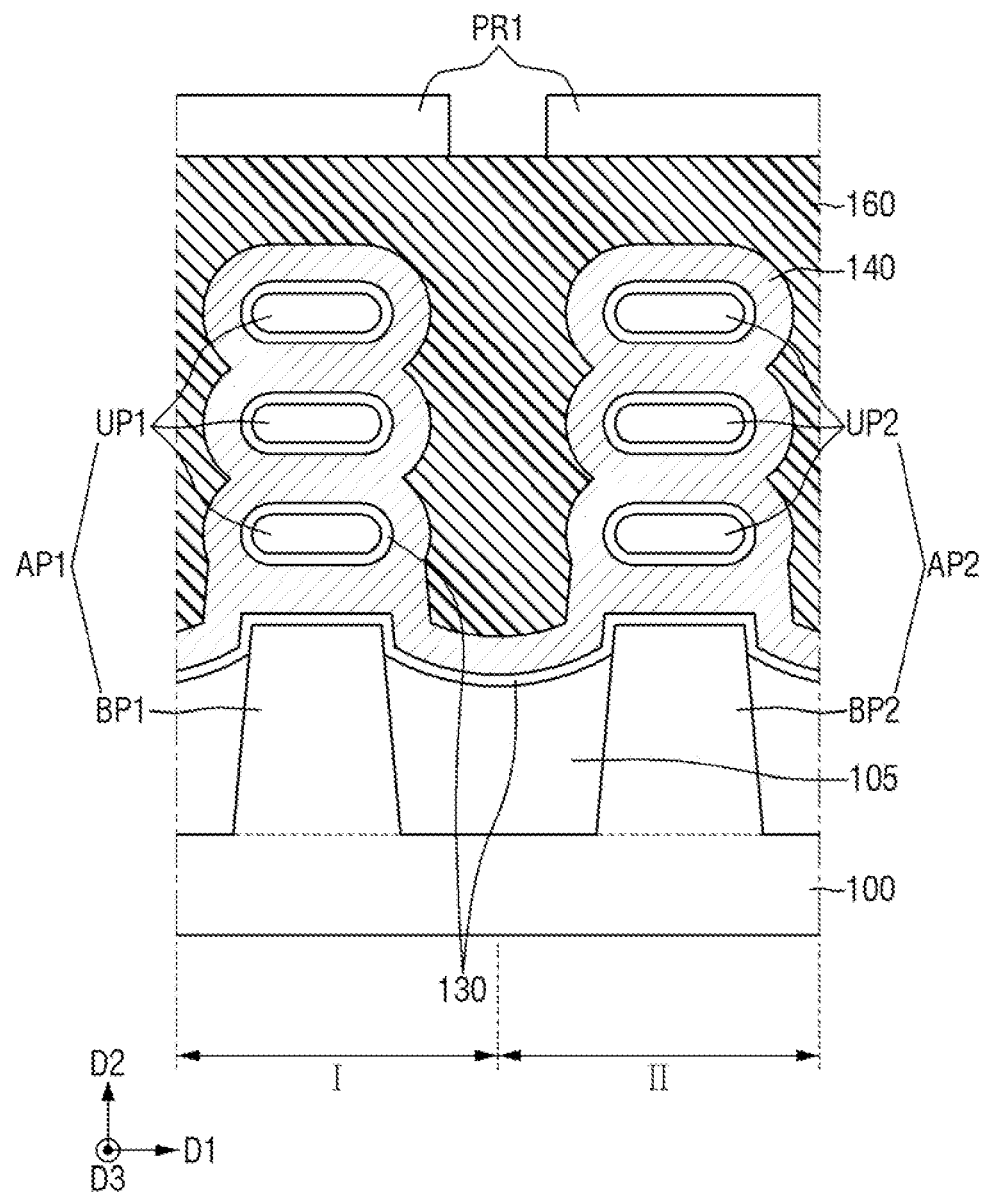

Referring to FIG. 15, a first photoresist PR1 may be formed on the sacrificial layer 160.

Figure 16:
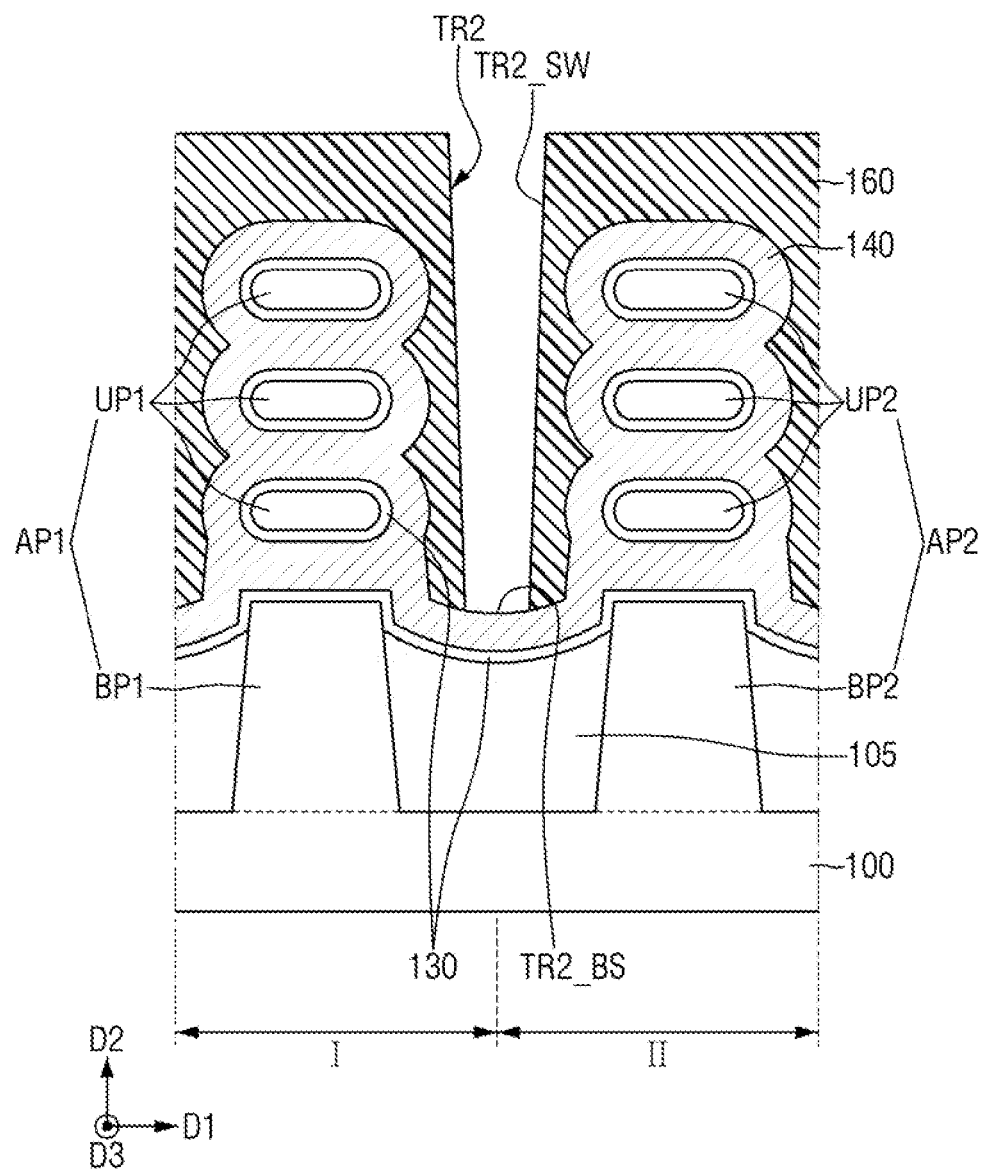

The first photoresist PR1 may have an opening that schematically defines a position of a first trench (TR1 of FIG. 16). The first photoresist PR1 may be formed of at least one of a photoresist film, an ACL (Amorphous Carbon Layer), a SOH (Spin on Hardmask), an SOC (Spin on Carbon), and a silicon nitride film.

Referring to FIG. 16, the first trench TR1 may be formed using the first photoresist PR1 as a mask.

A part of the sacrificial layer 160 may be removed through a dry etching process. The sacrificial layer 160 is etched in the second direction D2 to form the second trench TR2. Although the second trench TR2 is shown as being formed at a boundary between the first region I and the second region II, this may be varied.

The second trench TR2 may include a side wall TR2_SW and a bottom surface TR2_BS of the second trench TR2. The second trench TR2 may expose the surface of the work function metal layer 140 and the surface of the sacrificial layer 160. The bottom surface TR2_BS of the second trench TR2 exposes the upper surface of the work function metal layer 140. The side wall TR2_SW of the second trench TR2 exposes the side wall of the sacrificial layer 160.

Figure 17:
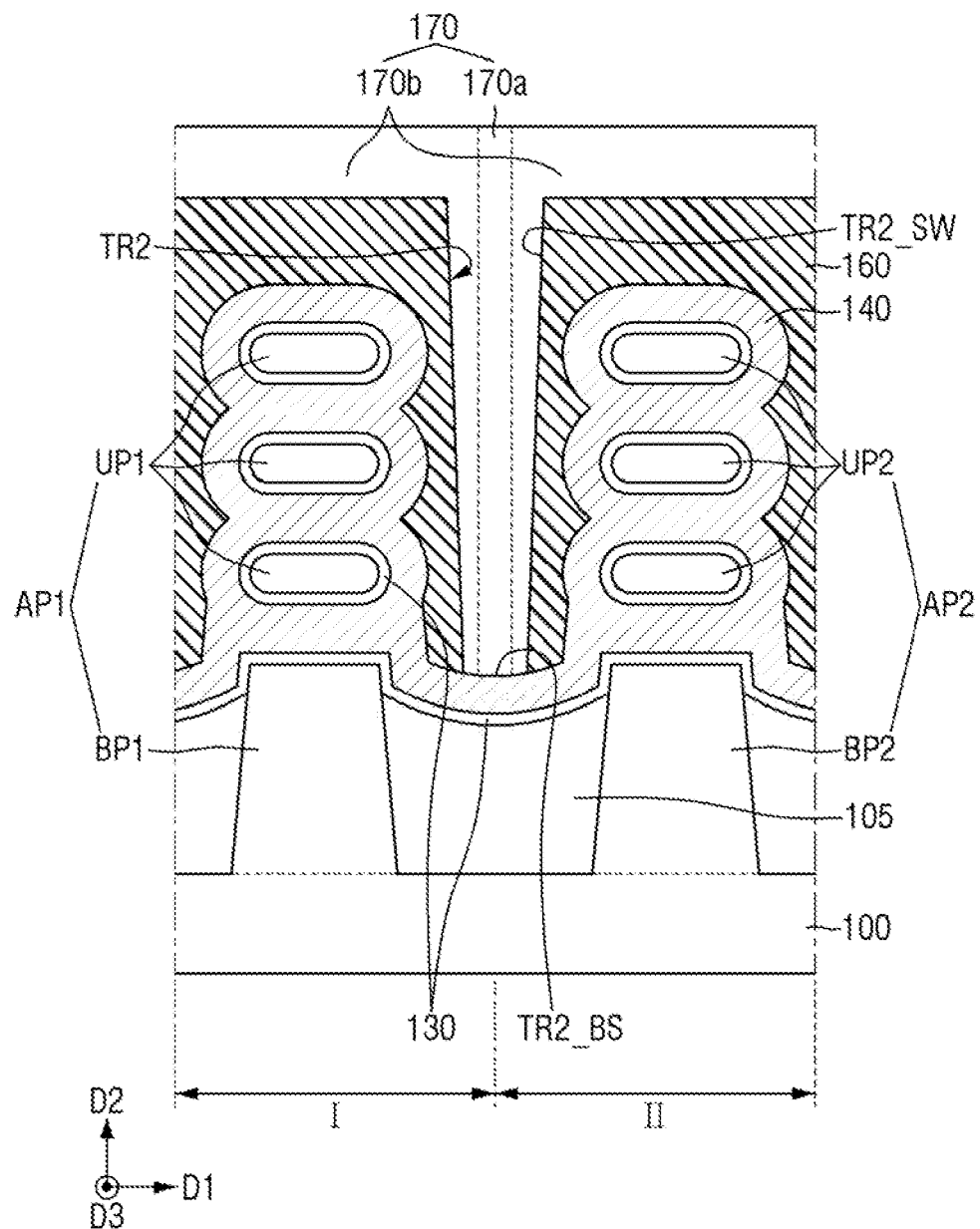

Referring to FIG. 17, the first polymer layer 170 that fills the second trench TR2 may be formed.

The first polymer layer 170 may be in contact with the bottom surface TR2_BS and the side wall TR2_SW of the second trench TR2. The first polymer layer 170 may include a first portion 170a and a second portion 170b. The first portion 170a of the first polymer layer 170 may be a portion that is in contact with the bottom surface TR2_BS of the second trench TR2, and the second portion 170b of the first polymer layer 170 may be a portion that is in contact with the side wall TR2_SW of the second trench TR2. The first portion 170a of the first polymer layer 170 may be a portion that is in contact with the work function metal layer 140, and the second portion 170b of the first polymer layer 170 may be a portion that is in contact with the sacrificial layer 160. Although the first portion 170a of the first polymer layer 170 is shown to be interposed between the second portions 170b of the first polymer layer 170, this is merely an example.

The first polymer layer 170 may be formed at a temperature of 0° C. or higher and 120° C. or lower. The first polymer layer 170 may be vapor-deposited at a temperature of 0° C. or higher and 120° C. or lower, using a chemical vapor deposition (CVD) or an atomic layer deposition (ALD).

The first polymer layer 170 may include the same substance as the first polymer layer 30 described using FIG. 4.

Figure 18:
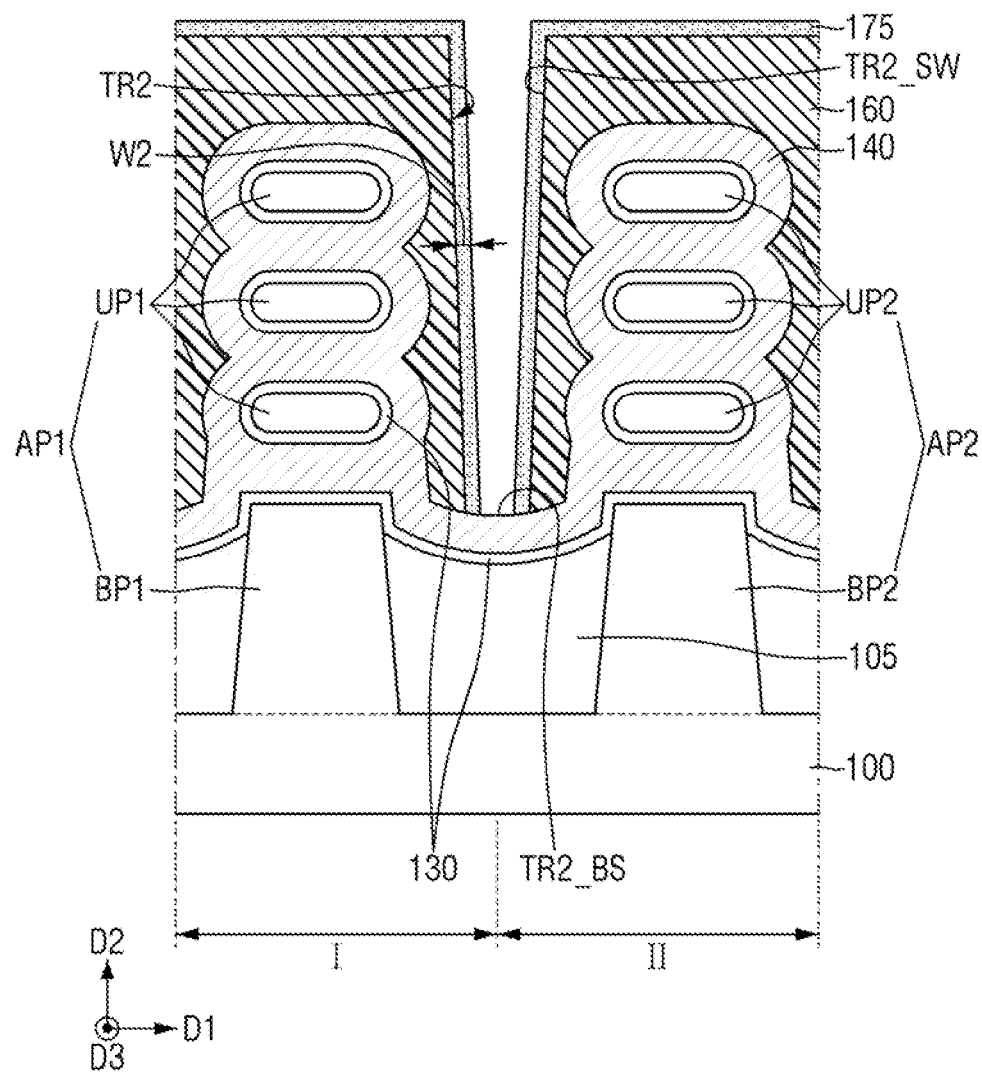

Referring to FIG. 18, the second polymer layer 175 may be formed. The second polymer layer 175 may be formed along the surface of the sacrificial layer 160. The second polymer layer 175 may not be formed along the surface of the work function metal layer 140.

The second polymer layer 175 may be formed through a heat treatment process. The heat treatment process may be performed at a temperature of 150° C. or higher and 250° C. or lower. The heat treatment process may be performed for a time of 1 minute or more and 4 minutes or less.

When the heat treatment process is performed, hydrogen ions ($H^+$) may be generated inside the sacrificial layer 160 to react with the first polymer layer 170 on the side wall TR2_SW of the second trench TR2. The first polymer layer 170 may include a substance that may be cross-linked with an acid, and thus when the first polymer layer 170 reacts with hydrogen ions ($H^+$), the first polymer layer 170 may be cross-linked to form the second polymer layer 175.

On the other hand, even if the heat treatment process is performed, the second polymer layer 175 is not formed on the surface of the work function metal layer 140, e.g., the first polymer layer 170 may not be cross-linked on the surface of the work function metal layer 140. Although the heat treatment process may be performed, hydrogen ions ($H^+$) may not be generated inside the work function metal layer 140. Therefore, the first polymer layer 170 on the surface of the work function metal layer 140 is not cross-linked. Also, the first polymer layer 170 on the surface of the work function metal layer 140 may be decomposed when the heat treatment process is performed. Therefore, the second polymer layer 175 may be selectively formed on the surface of the sacrificial layer 160.

The second polymer layer 175 may be formed to have a very thin thickness. For example, a width W2 of the second polymer layer 175 in the first direction D1 may be 10 nm or less, e.g., 5 nm or less.

The second polymer layer 175 may include substantially the same substance as the second polymer layer 35 described in connection with FIG. 5.

Figure 19:
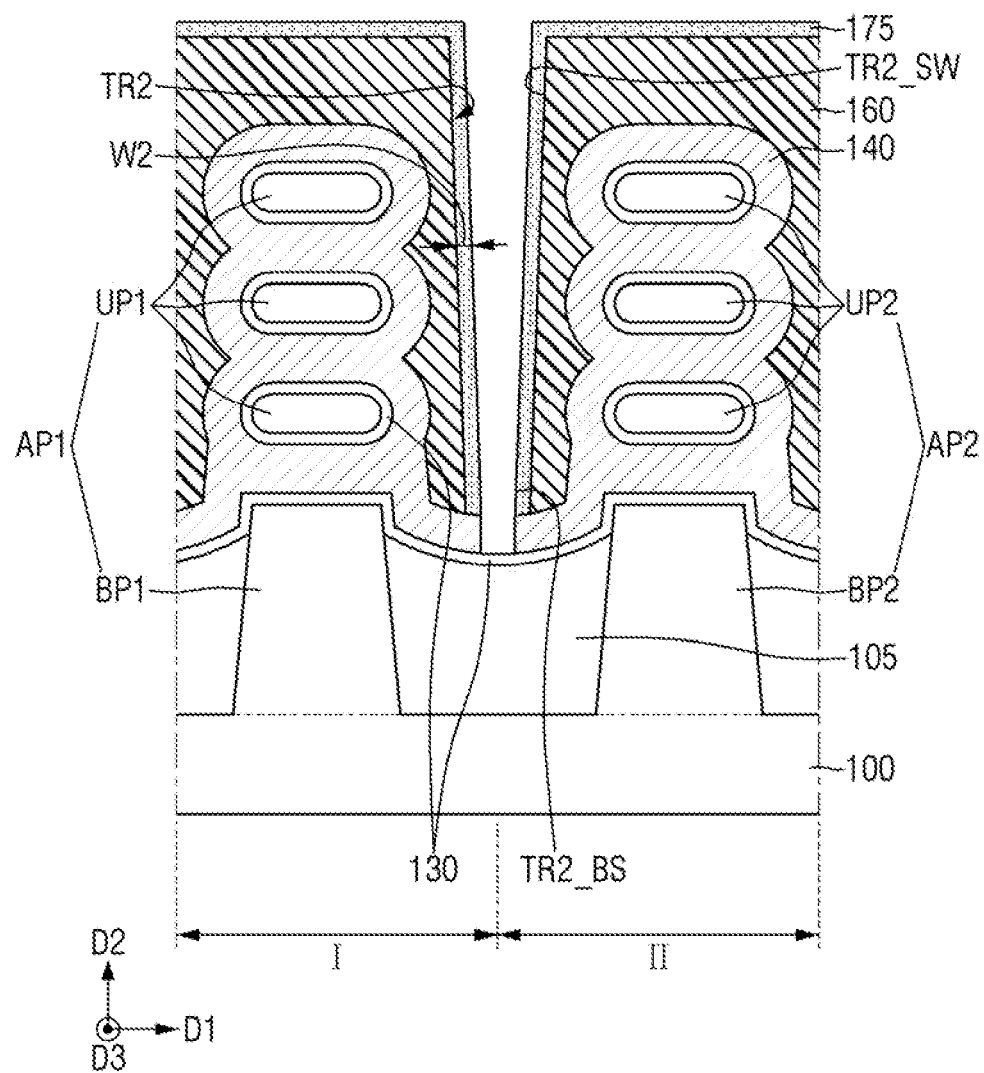

Referring to FIG. 19, a part of the work function metal layer 140 may be removed to expose the gate insulating film 130.

Thus, the work function metal layer 140 on the first region I and the work function metal layer 140 on the second region II may be separated. The work function metal layer 140 may be removed using a wet etching process. Therefore, the work function metal layer 140 may be removed through the isotropic etching.

Figure 20:
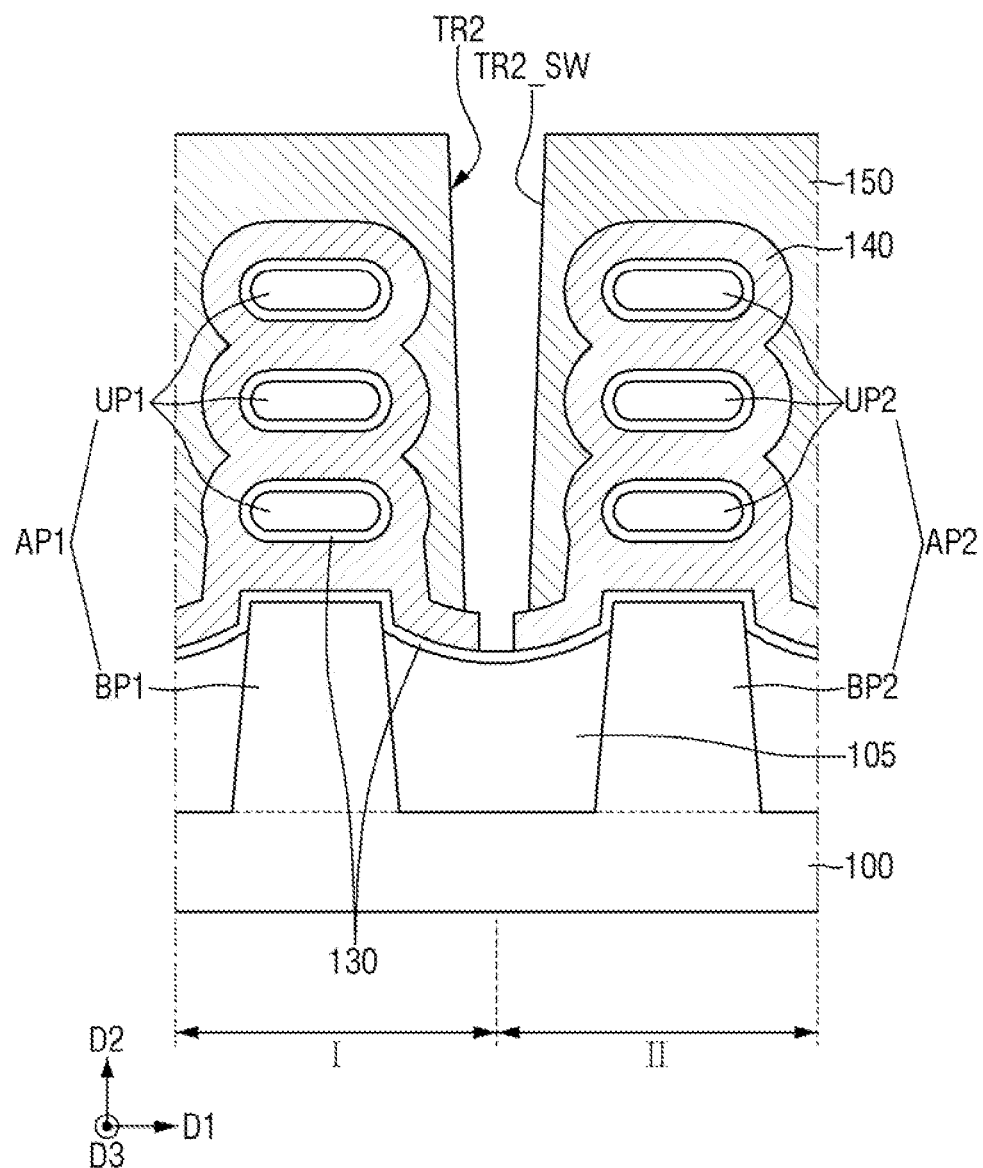

Referring to FIG. 20, the gap fill insulating material inside the second polymer layer 175 and the sacrificial layer 160 may be removed.

The protective layer 150 may be formed by removing the gap fill insulating material inside the second polymer layer 175 and the sacrificial layer 160. The gap fill insulating material inside the second polymer layer 175 and the sacrificial layer 160 may be removed at the same time. The second trench TR2 may also expose a part of the work function metal layer 140 and a part of the gate insulating film 130.

The gap fill insulating material inside the sacrificial layer 160 may be removed using, e.g., a wet etching process or an ashing process.

Figure 21:
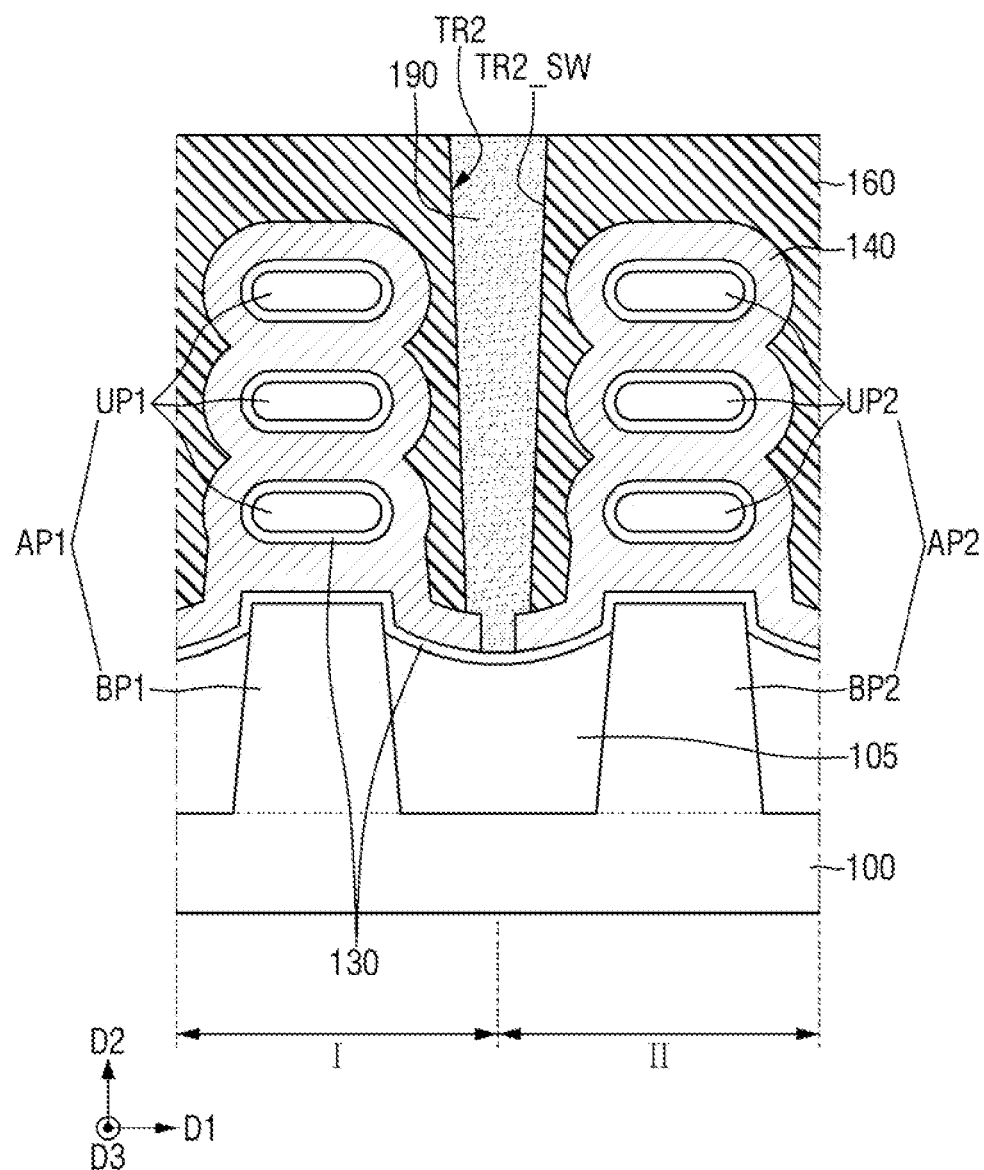

Referring to FIG. 21 a gap fill insulating layer 190 may be formed on the substrate 100.

A gap fill insulating material may be applied onto the substrate 100. The applied gap fill insulating material may be combined with the protective layer 150 to form the sacrificial layer 160. The gap fill insulating material may fill the second trench TR2. The gap fill insulating material may fill the second trench TR2 to form the gap fill insulating layer 190. Thus, the gap fill insulating layer 190 may cover the exposed gate insulating film 130 and the exposed work function metal layer 140.

The gap fill insulating layer 190 may include, e.g., a gap fill insulating material. As another example, the gap fill insulating layer 190 may be, e.g., a dry etch resistance layer or a wet etch resistance layer.

Figure 22:
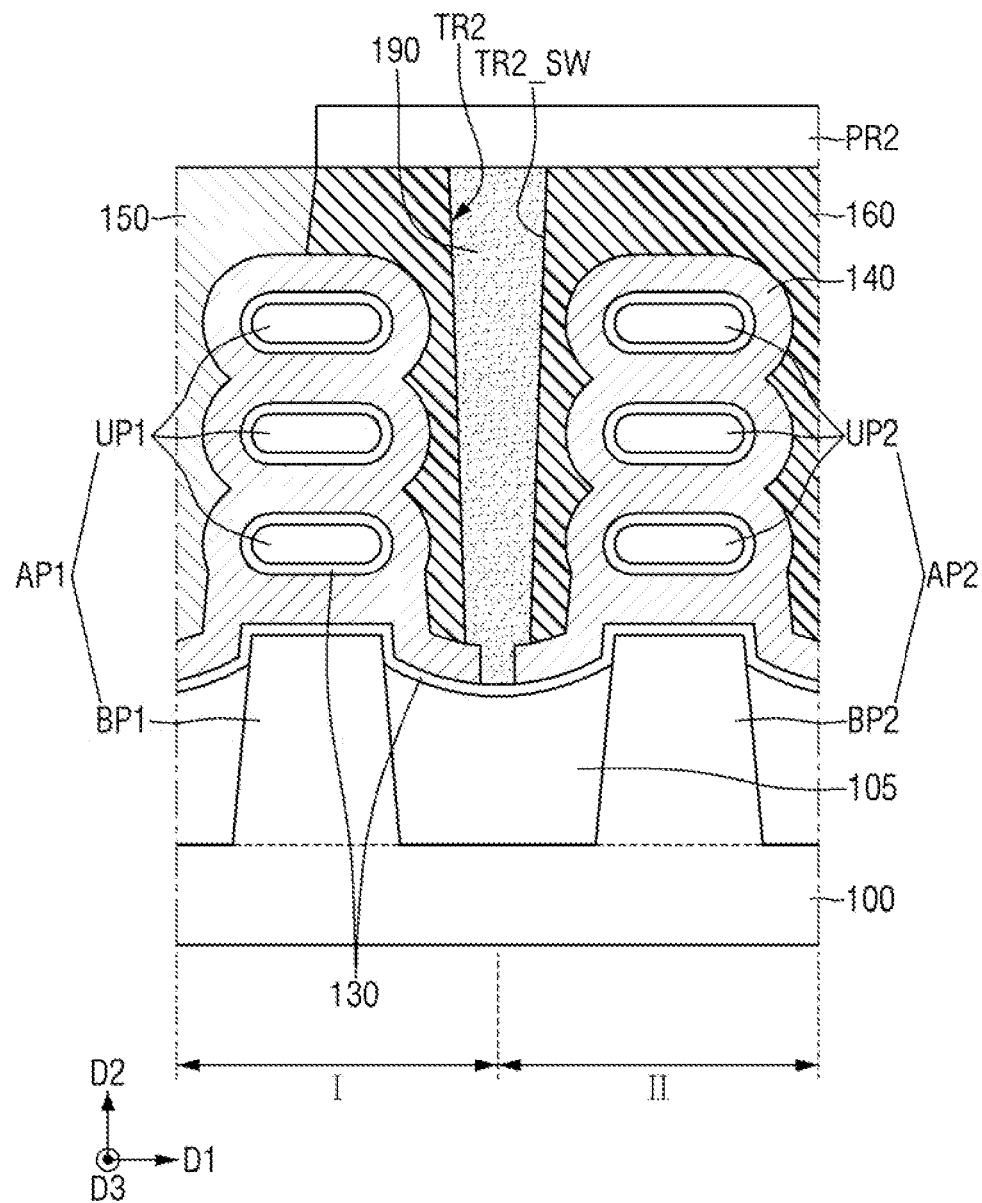

Referring to FIG. 22, a second photoresist PR2 may be formed on the sacrificial layer 160 and the gap fill insulating layer 190.

The second photoresist PR2 may cover the sacrificial layer 160 on the second region II, a part of the sacrificial layer 160 on the first region I, and the gap fill insulating layer 190.

The second photoresist PR2 may be formed of at least one of a photoresist film, an ACL (Amorphous Carbon Layer), a SOH (Spin on Hardmask), a SOC (Spin on Carbon), and a silicon nitride film.

Next, the gap fill insulating material inside the sacrificial layer 160 may be removed, using the second photoresist PR2 as a mask. The gap fill insulating material inside the sacrificial layer 160 may be removed to form the protective layer 150. The gap fill insulating material inside the sacrificial layer 160 may be removed, e.g., using a dry etching process.

Figure 23:
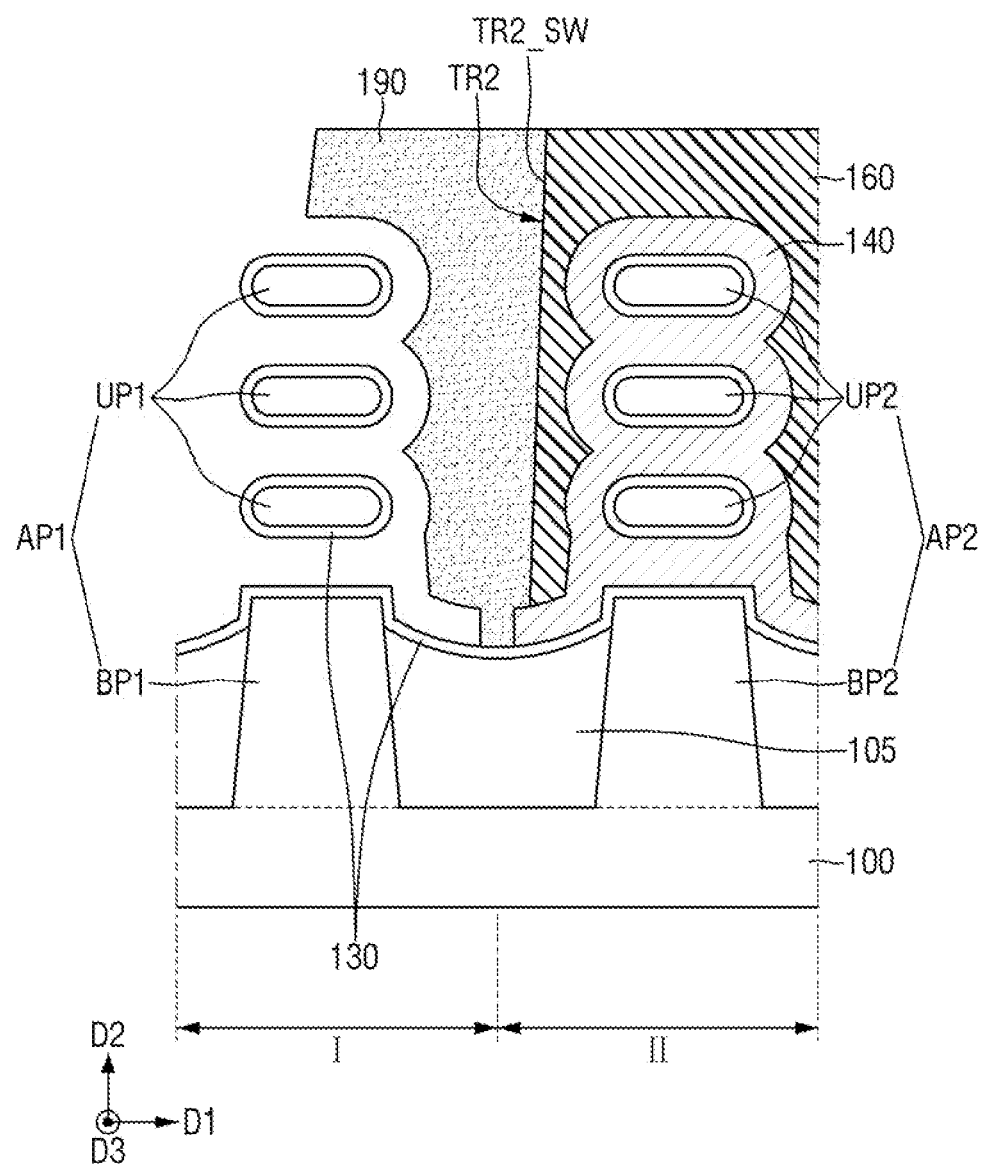

Referring to FIG. 23, the protective layer 150 and the work function metal layer 140 of the first region I may be removed. Only the protective layer 150 of the first region I may be selectively removed.

The protective layer 150 and the work function metal layer 140 of the first region I may be removed using a wet etching process. When the wet etching process is used, the protective layer 150 and the work function metal layer 140 may be removed, but the gap fill insulating material and the gap fill insulating layer 190 may not be removed. The etchant of the wet etching process may not penetrate the gap fill insulating material and the gap fill insulating layer 190. Therefore, the etchant may not reach the sacrificial layer 160 of the second region II. The sacrificial layer 160 of the second region II may not be removed.

That is, the protective layer 150 and the work function metal layer 140 of the first region I may be selectively removed.

Figure 24:
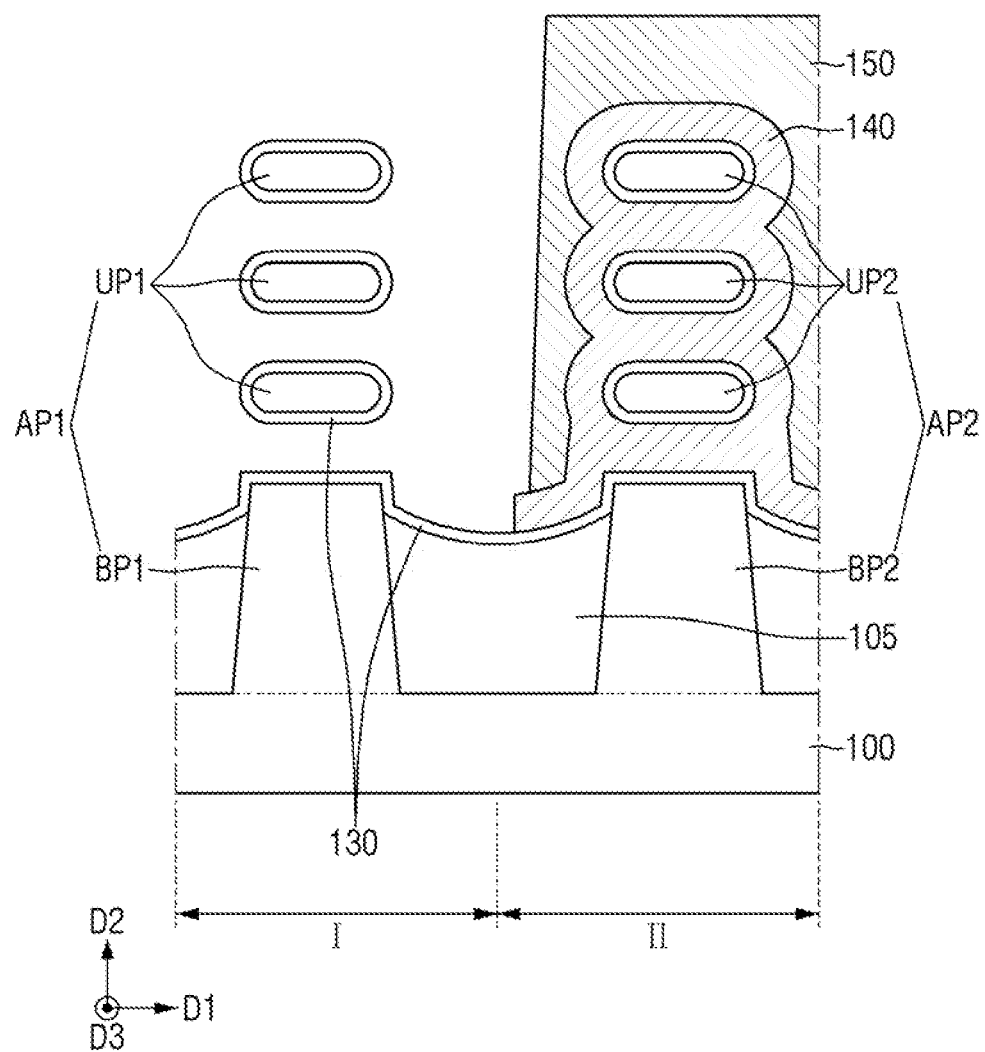

Referring to FIG. 24, the gap fill insulating layer 190 and the gap fill insulating material inside the sacrificial layer 160 of the second region II may be removed.

The gap fill insulating material inside the sacrificial layer 160 of the second region II may be removed to form the protective layer 150. The gap fill insulating layer 190 and the gap fill insulating material inside the sacrificial layer 160 of the second region II may be removed through, e.g., a wet etching process or an ashing process.

In some example embodiments, all the work function metal layers 140 on the first region I are removed, and the work function metal layers 140 on the second region II are not removed through the aforementioned process. The gate insulating film 130 that wraps around the first sheet pattern UP1 is exposed, and the gate insulating film 130 that wraps around the second sheet pattern UP2 is not exposed.

In some example embodiments, an NMOS may be formed in the first region I, and a PMOS may be formed in the second region II.

As described above, embodiments relate to a semiconductor device manufacturing method using selective cross-linking.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device manufacturing method, comprising:
providing a first layer having a first surface; providing a second layer including a trench that exposes the first surface, onto the first layer;
forming a first polymer layer that fills the trench; and
performing a heat treatment process on the first polymer layer to form a second polymer layer, wherein:
a second surface of the second layer is exposed by the trench, the first polymer layer includes a first portion being in contact with the first surface, and a second portion being in contact with the second surface,
when the heat treatment process is performed, the first portion of the first polymer layer is decomposed,
when the heat treatment process is performed, the second portion of the first polymer layer is cross-linked to form the second polymer layer, and
physical properties of the first layer are different from physical properties of the second layer, and
wherein the first polymer layer includes a substance represented by Chemical Formula 1:

[Chemical Formula 1]

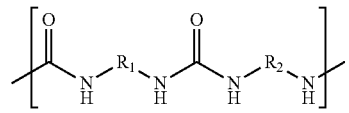

wherein, in Chemical Formula 1,
$R_1$ is a substituted or unsubstituted alkyl group having 2 to 8 carbon atoms, or a substituted or unsubstituted benzene group, and
$R_2$ is a substituted or unsubstituted alkyl group having 2 to 8 carbon atoms, an alkylamino group having 4 to 6 carbon atoms, or a substituted or unsubstituted benzene group.

2. The semiconductor device manufacturing method as claimed in claim 1, wherein $R_1$ and $R_2$ each include a double bond or a triple bond, independently of each other.

3. The semiconductor device manufacturing method as claimed in claim 1, wherein:
the first polymer layer is formed at a temperature of 0° C. or higher and 120° C. or lower, and
the heat treatment process is performed at a temperature of 150° C. or higher and 250° C. or lower.

4. The semiconductor device manufacturing method as claimed in claim 1, wherein:
the heat treatment process generates hydrogen ions on the second surface of the second layer, and
the second portion of the first polymer layer reacts with the hydrogen ions to form the second polymer layer.

5. The semiconductor device manufacturing method as claimed in claim 1, wherein:
the first polymer layer is formed by reaction of a first precursor with a second precursor,
the first precursor includes a substance represented by Chemical Formula 2, and
the second precursor includes a substance represented by Chemical Formula 3,

[Chemical Formula 2]

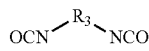

wherein, in Chemical Formula 2, $R_3$ is a substituted or unsubstituted alkyl group having 2 to 8 carbon atoms, or a substituted or unsubstituted benzene group;

[Chemical Formula 3]

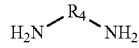

wherein, in Chemical Formula 3, $R_4$ is a substituted or unsubstituted alkyl group having 2 to 8 carbon atoms, an alkylamino group having 4 to 6 carbon atoms, or a substituted or unsubstituted benzene group.

6. The semiconductor device manufacturing method as claimed in claim 5, wherein:
the first precursor includes at least one of 1,4-diisocyanato-2-butene and 1,4-diisocyanato-2-butyne, and
the second precursor includes at least one of 2-butene-1,4-diamine and 2-butyne-1,4-diamine.

7. The semiconductor device manufacturing method as claimed in claim 1, wherein a width of the second polymer layer is 10 nm or less.

8. A semiconductor device manufacturing method, comprising:
forming a gap fill insulating layer on a titanium nitride layer;
etching the gap fill insulating layer to form a trench;
forming a polyurea layer that fills the trench; and
performing a heat treatment process on the polyurea layer to form a polymer layer, wherein:

the trench exposes side walls of the gap fill insulating layer and an upper surface of the titanium nitride layer,
the polyurea layer includes a first portion being in contact with the upper surface of the titanium nitride layer, and a second portion being in contact with the side walls of the gap fill insulating layer,
when the heat treatment process is performed, the first portion of the polyurea layer is decomposed,
when the heat treatment process is performed, the gap fill insulating layer generates hydrogen ions,
when the heat treatment process is performed, the second portion of the polyurea layer reacts with the hydrogen ions and is cross-linked to form the polymer layer, and
the polyurea layer includes a substance represented by Chemical Formula 1,

[Chemical Formula 1]

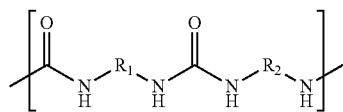

wherein, in Chemical Formula 1,
$R_1$ is a substituted or unsubstituted alkyl group having 2 to 8 carbon atoms, or a substituted or unsubstituted benzene group, and
$R_2$ is a substituted or unsubstituted alkyl group having 2 to 8 carbon atoms, an alkylamino group having 4 to 6 carbon atoms, or a substituted or unsubstituted benzene group.

9. The semiconductor device manufacturing method as claimed in claim 8, wherein:
the polyurea layer is formed by reaction of a first precursor with a second precursor,
the first precursor includes at least one of ethylene diisocyanate, trimethylene diisocyanate, tetramethylene diisocyanate, pentamethylene diisocyanate, hexamethylene diisocyanate, heptamethylene diisocyanate, octamethylene diisocyanate, phenyl diisocyanate, 1,4-diisocyanato-2-butene, and 1,4-diisocyanato-2-butyne, and
the second precursor includes at least one of ethylene diamine, trimethylene diamine, tetramethylene diamine, pentamethylene diamine, hexamethylene diamine, heptamethylene diamine, octamethylene diamine, diethylene triamine, 2-butene-1,4-diamine, and 2-butyne-1,4-diamine.

10. The semiconductor device manufacturing method as claimed in claim 9, wherein:
the first precursor includes at least one of 1,4-diisocyanato-2-butene and 1,4-diisocyanato-2-butyne, and
the second precursor includes at least one of 2-butene-1,4-diamine and 2-butyne-1,4-diamine.

11. The semiconductor device manufacturing method as claimed in claim 8, wherein:
the polyurea layer is formed at a temperature of 0° C. or higher and 120° C. or lower, and
the heat treatment process is performed at a temperature of 150° C. or higher and 250° C. or lower.

12. The semiconductor device manufacturing method as claimed in claim 8, wherein $R_1$ and $R_2$ each include a double bond or a triple bond, independently of each other.

13. A semiconductor device manufacturing method, comprising:

providing a substrate including a first region and a second region;

forming a first sheet pattern on the substrate of the first region;

forming a second sheet pattern on the substrate of the second region;

forming a work function metal layer that wraps around the first sheet pattern and the second sheet pattern, on the substrate;

forming a sacrificial layer that covers the first and second sheet patterns, on the substrate;

forming a trench penetrating the sacrificial layer between the first sheet pattern and the second sheet pattern;

forming a first polymer layer that fills the trench; and forming a second polymer layer through a heat treatment process, wherein:

the trench exposes an upper surface of the work function metal layer and side walls of the sacrificial layer, the first polymer layer includes a first portion being in contact with the upper surface of the work function metal layer, and a second portion being in contact with the side walls of the sacrificial layer, the first portion of the first polymer layer is decomposed through the heat treatment process, the second portion of the first polymer layer is cross-linked through the heat treatment process to form the second polymer layer, and the work function metal layer includes titanium nitride, and wherein the first polymer layer includes a substance represented by Chemical Formula 1,

[Chemical Formula 1]

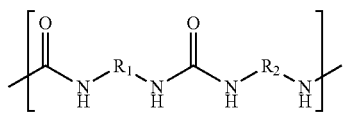

wherein, in Chemical Formula 1, $R_1$ is a substituted or unsubstituted alkyl group having 2 to 8 carbon atoms, or a substituted or unsubstituted benzene group, and $R_2$ is a substituted or unsubstituted alkyl group having 2 to 8 carbon atoms, an alkylamino group having 4 to 6 carbon atoms, or a substituted or unsubstituted benzene group.

14. The semiconductor device manufacturing method as claimed in claim 13, wherein:

the first polymer layer is formed by reaction of a first precursor with a second precursor, the first precursor includes at least one of ethylene diisocyanate, trimethylene diisocyanate, tetramethylene diisocyanate, pentamethylene diisocyanate, hexamethylene diisocyanate, heptamethylene diisocyanate, octamethylene diisocyanate, phenyl diisocyanate, 1,4-diisocyanato-2-butene, and 1,4-diisocyanato-2-butyne, and the second precursor includes at least one of ethylene diamine, trimethylene diamine, tetramethylene diamine, pentamethylene diamine, hexamethylene diamine, heptamethylene diamine, octamethylene diamine, diethylene triamine, 2-butene-1,4-diamine, and 2-butyne-1,4-diamine.

15. The semiconductor device manufacturing method as claimed in claim 14, wherein:

the first precursor includes at least one of 1,4-diisocyanato-2-butene and 1,4-diisocyanato-2-butyne, and the second precursor includes at least one of 2-butene-1,4-diamine and 2-butyne-1,4-diamine.

16. The semiconductor device manufacturing method as claimed in claim 13, wherein a width of the second polymer layer is 10 nm or less.

17. The semiconductor device manufacturing method as claimed in claim 13, wherein an NMOS is formed on the substrate of the first region, and a PMOS is formed on the substrate of the second region.

18. The semiconductor device manufacturing method as claimed in claim 13, wherein:

the first polymer layer is formed at a temperature of 0° C. or higher and 120° C. or lower, and the heat treatment process is performed at a temperature of 150° C. or higher and 250° C. or lower.

* * * * *